(12) United States Patent
Natzle

(10) Patent No.: US 7,211,496 B1
(45) Date of Patent: *May 1, 2007

(54) FREESTANDING MULTIPLAYER IC WIRING STRUCTURE

(75) Inventor: Wesley C. Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/567,337

(22) Filed: May 9, 2000

Related U.S. Application Data

(63) Continuation-in-part of application No. 09/064,546, filed on Apr. 22, 1998, now Pat. No. 6,097,092.

(51) Int. Cl.
*H01L 21/76* (2006.01)
*H01L 21/44* (2006.01)

(52) U.S. Cl. .................. 438/411; 438/421; 438/666; 257/E21.573; 257/E21.581; 257/E21.585

(58) Field of Classification Search ............... 438/411, 438/421–422, 519, 666, 619; 257/E21.573, 257/E21.581, E21.585
See application file for complete search history.

(56) References Cited

U.S. PATENT DOCUMENTS

| | | | |
|---|---|---|---|
| 4,899,439 A | 2/1990 | Potter et al. | |
| 5,141,896 A | 8/1992 | Katoh | |
| 5,144,411 A | 9/1992 | Kaanta et al. | |
| 5,227,658 A | 7/1993 | Beyer et al. | |
| 5,324,683 A | 6/1994 | Fitch et al. | |
| 5,338,975 A | 8/1994 | Cole, Jr. et al. | |
| 5,391,921 A | 2/1995 | Kudoh et al. | |
| 5,413,962 A | 5/1995 | Lur et al. | |
| 5,559,367 A | 9/1996 | Cohen et al. | |
| 5,572,042 A | 11/1996 | Thomas et al. | |
| 5,744,865 A | 4/1998 | Jeng et al. | |
| 5,866,920 A | 2/1999 | Matsumoto et al. | |
| 6,097,092 A * | 8/2000 | Natzle ..................... | 257/758 |
| 6,268,277 B1 * | 7/2001 | Bang ....................... | 438/619 |
| 6,451,669 B2 * | 9/2002 | Torres et al. ............. | 438/409 |
| 6,495,445 B2 * | 12/2002 | Clevenger et al. ....... | 438/619 |
| 6,784,084 B2 * | 8/2004 | Kang et al. .............. | 438/586 |

* cited by examiner

*Primary Examiner*—Walter Lindsay, Jr.
(74) *Attorney, Agent, or Firm*—Joseph P. Abate; Greenblum & Bernstein, PLC

(57) ABSTRACT

A dielectric wiring structure and method of manufacture therefor. The wiring structure includes air dielectric formed in a hemisphere. The wiring structure also includes, in embodiments, a method of simultaneously forming a MEMS structure with a transistor circuit using substantially the same steps. The MEMS structure of this embodiment includes freestanding electrodes which are not fixed to the substrate.

14 Claims, 19 Drawing Sheets

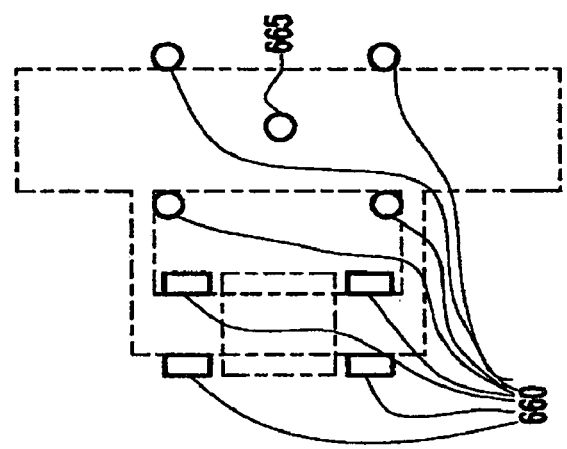
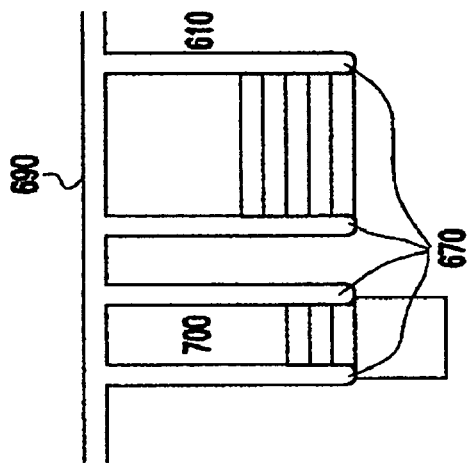
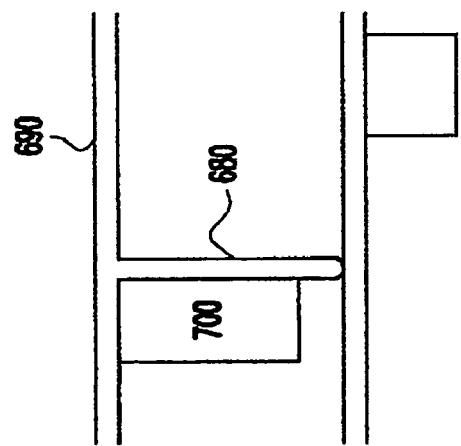

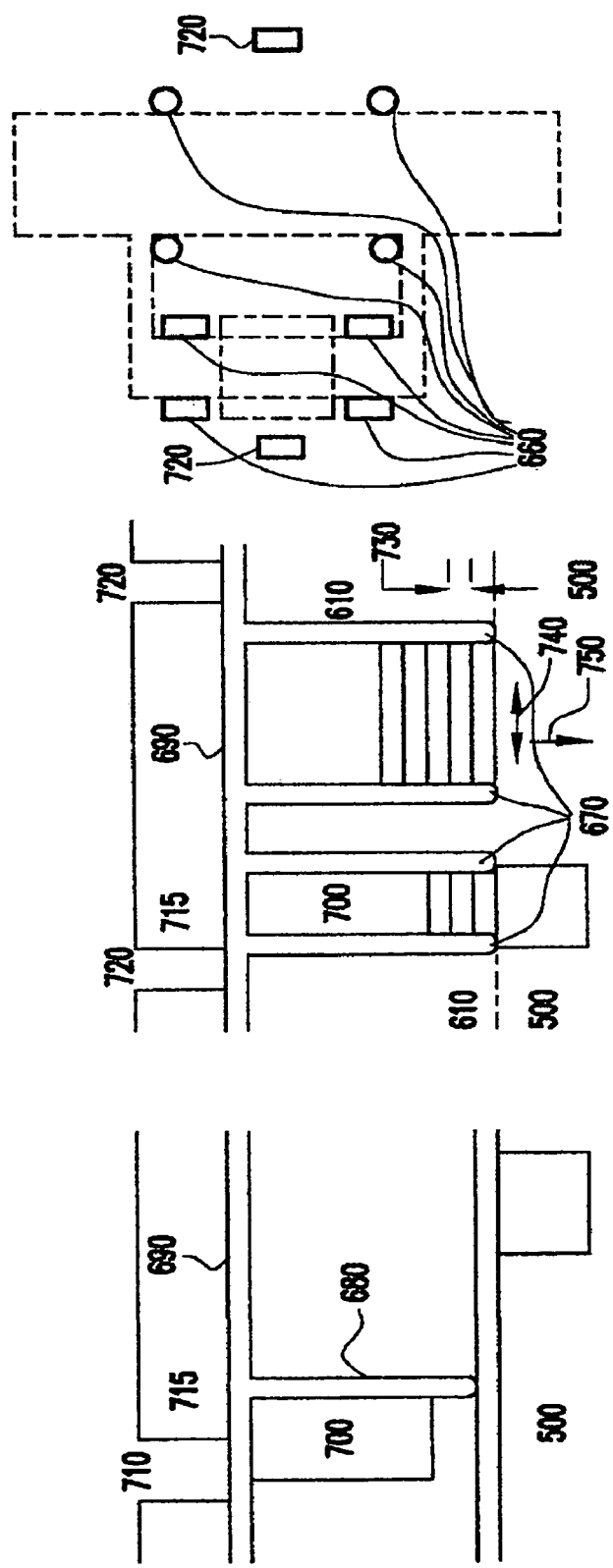

FREESTANDING MULTIPLAYER IC WIRING STRUCTURE

RELATED APPLICATION

This application is a continuation-in-part of U.S. application Ser. No. 09/064,546 filed on Apr. 22, 1998, and now issued as U.S. Pat. No. 6,097,092.

BACKGROUND OF THE INVENTION

1. Field of the Invention

The present invention is related to microelectronics and, more particularly, to microelectronics having air dielectric wiring for reduced capacitance or having a cavity which contains micro-mechanical or micro-electromechanical structures.

2. Background Description

Integrated circuit (IC) performance is dependent upon individual circuit performance. Individual circuit performance is dependent on the load the circuit must drive. For field effect transistor (FET) circuits, the primary load is capacitive. The primary source of the circuit load capacitance is inter-circuit wiring capacitance. Thus, IC performance can be improved by reducing wiring capacitance.

Typical IC chips with a large number of logic circuits include multiple layers of wires, called wiring layers, stacked one on top of another and separated by dielectric material. The ideal dielectric is air or, at least has the same dielectric constant as air. There are several approaches to providing an air dielectric in IC chips.

Another type of microelectronic chip includes microelectromechanical (MEM) devices, preferably integrated on the same substrate with transistors and their interconnections. Motion of the MEM devices requires that they be within a gas or vacuum filled cavity.

Freestanding Wiring Structures

One approach is to remove the dielectric around the wires, suspending the wiring in air. The suspended wires are uncovered with any dielectric and are supported, mechanically, only by interlevel metal studs used to form the circuit. Although scanning electron microscopic (SEM) images of such structures clearly show that small lengths of wire are self supporting, longer lengths of wire are not self-supporting. So, longer lengths of unsupported wire are susceptible to shorting.

For example, U.S. Pat. No. 4,899,439 entitled "Method of Fabricating A High Density Electrical Interconnect" to Potter et al. teaches building pillars from the substrate under the wires extending upward to upper wiring levels wherever support is required. However, because wiring channels must be allocated for these pillars, the pitch or density of wires is reduced by as much as half.

Another approach is to stiffen the wires, such as taught in U.S. Pat. No. 5,148,260 entitled "Semiconductor Device Having an Improved Air Bridge Lead Structure" to Inoue et al., wherein the metal lines are formed from a stiffer composite metal that is less likely to deform than typical wiring metals. This approach reduces, but does not eliminate shorting in an air dielectric IC structure. Further, Inoue et al., also requires including some support pillars, although not as many are required as in Potter et al.

Both Potter et al. and Inoue et al. teach structures that are formed using conventional techniques, with the removable dielectric material removed through several repeating layers of metal studs and metal lines. Material may be backfilled around the freestanding wires to provide a dielectric other than air.

Gravity is the primary focus in abating shorting problems in prior art freestanding IC wiring structures. Other accelerations such as vibrations and impact are also a problem. Thus, to counteract gravity, a strong support is provided from below the wires.

The above examples of the prior art incur a substantial wiring density penalty because the support pillars extend through several wiring levels, all the way up from an underlying substrate. These small diameter support pillars are formed level by level and so, must be lined up at each level with an underlying level.

To simplify this critical alignment requirement, a stiff intermediate planar layer may be formed on each support pillar level. Thus, the pillars would support the planar layer and the planar layer supports another pillar level. For this type structure, pillars need not line up from level to level. However, any dielectric must be removed after the planar layer is formed by complex venting and filling steps or the dielectric is trapped under the permanent planar layer.

A typical prior art approach, when using planar layers to construct freestanding structures, is to form an air dielectric on a layer by layer basis. For example, in U.S. Pat. No. 5,144,411 entitled "Method and Structure for Providing Improved Insulation in VLSI and ULSI Circuits", to Kaanta et al. (hereinafter Kaanta), a planar dielectric layer is formed directly below the next higher level of metal lines but above a lower layer of metal lines or on pedestals above the lower layer of metal lines with a complex process requiring extra masks. Kaanta teaches etching access openings through the planar layer, removing the dielectric and plugging the openings. Presumably, the next level of metal lines is formed on top of the planar dielectric by Reactive Ion Etch (RIE) of a metal layer which was deposited on the planer dielectric. Each successive metal layer is formed on top of a permanent planar layer of dielectric.

In Kaanta, the wire is anchored on only a single surface of the wire, and that surface is a flat surface on the underside of the wire. The flat surface, in turn, is anchored to the planar layer. Such a structure, stemming from the RIE method used to pattern the metal on top of the planar layer is susceptible to detachment from shear forces in a direction parallel to the planar layer. A more stable structure is needed to increase the stability of the structure. Furthermore, it is difficult to pattern certain metals such as copper by RIE, and thus an alternative method is needed.

U.S. Pat. No. 5,444,015 entitled "Larce (sic) Scale IC Personalization Method Employing Air Dielectric Structure for Extended Conductors" to Aitken et al. (Hereinafter Aitken), assigned to the assignee of the present invention, teaches an approach similar to Kaanta that reduces the extra masks by forming openings in a removable dielectric for studs and supports simultaneously.

In Aiken, however, the wire is anchored on only a single surface of the wire, and that surface is a flat surface on the underside of the wire which is anchored to the planar layer. Such a structure, stemming from the deposition of metal onto a completely planar layer, may be susceptible to detachment from shear forces in a direction parallel to the planar layer.

Also, the support dimensions in Aitken are not as large as studs. After forming support openings, Aitken teaches depositing dielectric to fill the support locations and line stud openings. An anisotropic etch removes support dielectric from the bottom of the stud openings that are filled with metal in subsequent steps. Aitken stud opening diameters must be wider (twice the thickness of the dielectric tube) than the studs themselves, which must be larger than the minimum process dimension.

Prior art structures are typically supported by pedestals. The circuit design tools must keep track of whether interlevel features are studs or pedestals. Further, circuit design is more complicated because the wiring and the support pedestals must be accounted for on each wiring level.

None of the methods of the previously discussed prior art is useful when the metal lines are patterned by polishing, such as by chemical-mechanical polishing (CMP). The industry is moving toward copper wiring which is patterned by CMP. A method for forming an air dielectric is needed which is compatible with copper processing.

Although Kaanta and Aitken can both have planar layers in their structures, they both suffer from previously mentioned structural weaknesses toward shear forces.

Freestanding Micro-Electromechanical Structures (MEMS)

Prior art MEM devices use freestanding self supporting structures composed of a sequence of polysilicon, metal, or sometimes silicon nitride studs and lines. Structures are supported by the underlying substrate. The interlevel freestanding structure is generally a conductor which is supported by the underlying substrate. In these structures, the electrical interconnects are at the substrate level, and the interconnects can not be made directly to overlying wiring or to the outside of the structure without first connecting down to the substrate. It is further noted that in the prior art systems, no unrelated structures, transistors or wiring are based below the MEM device because the substrate is needed for electrical contacts and to support the MEM structure. See for example, U.S. Pat. No. 5,367,136 to Buck, U.S. Pat. No. 5,578,976 to Yao, Gretillat et. al. in "IEEE Micro-Electro-Mechanical Systems Workshop, 1995, pg. 97–101", or Goldsmith et. al. in "IEEE Microwave and Guided Wave Letters, 8 No. 8, pp. 269–271.

Although MEMS have been integrated with electrical transistors and circuits on silicon (Bustillo et. al. Proceedings of the IEEE 85, No. 8, August 1998, on page 1556–1558) there is no known prior art related to integration of MEMS with electrical transistors and circuits which include wiring surrounded by a gap or air dielectric. There is also no known structure relating to a combination of MEMS with copper wiring, and more particularly to a combination with copper wiring which also includes an air dielectric.

Generally, MEMS structures are defined in a complete process block, independent of the process blocks used to define the transistors and wiring of the electrical circuits. Since the MEMS also occupy their own regions of silicon, cost savings are minimal compared to an approach which is able to combine a large number of process steps, each of which contributes to simultaneous formation of an element of both the circuit and the MEMS structures, or compared to an approach which is able to form MEMS structures above regions of silicon substrate which have transistors. Bustillo shows a structure (FIG. 5 of reference) where some process steps for MEMS formation are interleaved with steps used for circuit formation; however, the overlap is minimal and circuits can not reside under the MEMS. Bustillo does briefly discuss (but does not show any supporting Figures) a different structure where the independent MEMS process block, after completion of the circuitry process block, could be modified so that circuitry could reside under the MEMS.

Since the MEMS structure is already at the top of the substrate, there is an advantage that the electrical connections do not need to go back up to overlying wiring. However, there are severe restrictions placed upon the composition and conductivity of the wiring based partly on the fact that the MEMS structure is made of polysilicon and therefore requires temperatures higher than can be tolerated by many wiring materials. A low temperature process by Nguyen could replace the polysilicon with nickel, but the process would still require a block of processes independent from those required for the CMOS wiring. In any case, no prior art teaches MEMs overlying transistors with high conductivity wiring or in particular with a high performance dielectric.

Attempts to integrate MEMS with CMOS also pose problems. For instance, polysilicon gates in CMOS do not need to connect to the substrate, but prior art MEMS polysilicon does need to be supported by the substrate. Also, there is a need for BEOL MEMS which can be easily integrated with conventional CMOS BEOL. In particular, it is necessary to be able to pattern dissimilar metals on the same level so that the identity of the CMOS metal can be optimized for CMOS and the identity of the MEMS metal can be optimized for MEMS.

Also, MEMS structures are plagued by stress induced deformation of electrodes because electrodes/structures form internal stresses and strains during the construction of the structure which are relieved by deformation when the material surrounding the structure is etched to form a "released" or free-standing structure. (See for example Bustillo, page 1559 at the top of the second column.) Very narrow gaps are often required between the released structure and the counter-electrode on the substrate in order for the voltages required to operate the MEM device to be low enough so that they are compatible with the voltages required in associated electrical circuits. There is thus a trade off between wider gaps with higher device yields and a desire for low voltage operation with corresponding narrow gaps and therefore reduced yields.

Another limitation is that most MEMS structures use one element (electrode) which is freestanding and another element (substrate) which is not freestanding. In fact, the substrate is fixed. Also, a light, stiff moveable element has less susceptibility to acceleration, but drive voltages are increased (Proceedings of Aerospace conferences, 1997, IEEE, p. 285, modulus discussion). There is thus a need to simultaneously improve both the susceptibility and increased voltages to accelerations.

Materials and Processing

Materials used in prior art methods for creating air dielectrics are exotic and, so, are expensive to develop and difficult to remove. Kaanta, for example, teaches using parylene as a removable dielectric. Parylene has a low decomposition temperature, which severely restricts the materials that can be used for the freestanding structures.

Furthermore, typical prior art methods use aqueous chemicals to etch the removable material. It is uncertain whether these aqueous chemicals can penetrate the convoluted paths to regions buried deep within the wiring that must be cleared of removable dielectric. In particular, when dielectric removal is deferred until the end, or, for structures with vented planar layers such as U.S. Pat. No. 5,324,683 to Fitch et al. entitled "Method of Forming a Semiconductor Structure having an Air Region" (which is even more complex than Kaanta), these aqueous chemicals penetrate vent holes with considerable difficulty.

Further, after reaction and drying, the reaction products may not be removed completely from the nearly enclosed air dielectric compartments. These small openings make it difficult for reactants to diffuse in, or for waste products to diffuse out, when the cavities are filled with a liquid.

Additional problems arise when aqueous HF is used to remove oxides from the exposed metal lines. The HF in the aqueous solution can attack the metal, especially when the lines are a composite metal. Electrochemical potentials further contribute to corrosion of one metal of the composite. Such an attack can result in open electrical circuits, higher line resistivity, and the metal lines separating from their supports.

Thus, there is a need for a way to remove dielectric from metal lines without attacking the metal, with adequate penetration of small openings and subsequent removal of reaction waste products from the structure. Further there is a need for a way to form air dielectric structures on integrated circuit chips without increasing the number of masks, requiring complex vent and fill procedures or difficult support alignment.

SUMMARY OF THE INVENTION

It is a purpose of the invention to provide a manufacturable integrated circuit structure with an air dielectric wiring.

It is another purpose of the present invention to anchor the wiring in an air dielectric structure for mechanical strength to minimize shorts between wires.

It is yet another purpose of the present invention to provide a manufacturing process for fabricating integrated circuit structures with air dielectric wiring.

It is yet another purpose of the present invention to simplify manufacturing integrated circuit structures with air dielectric wiring.

It is yet another purpose of the present invention to provide a method of manufacturing air dielectric structures that can define wiring support after wiring definition.

It is yet another purpose of the present invention to provide a method of manufacturing air dielectric structures that does not require removing the dielectric and forming wires on a weak substrate.

It is yet another purpose of the present invention to provide a method of manufacturing air dielectric structures using existing integrated circuits and materials to create the air dielectric structure.

It is yet another purpose of the present invention to provide wiring which has a non-planar contact with a planar supporting plane.

It is yet another purpose of the present invention to provide air formation with Copper.

It is yet another purpose of the present invention to provide simultaneous MEMS cavity and air dielectric planar support in wiring and sidewall support in MEMS.

It is yet another purpose of the present invention to provide a process sequence using multiple common steps to lower the costs of manufacturing.

It is yet another purpose of the present invention to provide copper wiring with a dissimilar MEMS material between MEMS and wiring.

It is yet another purpose of the present invention to provide an AC/DC switch and voltage operated capacitor.

It is yet another purpose of the present invention to provide MEMS having a structure with less sensitivity to stresses and less susceptible to acceleration.

It is yet another purpose of the present invention to provide MEMS with high electrical conductivity.

It is yet another purpose of the present invention to provide MEMS elements with compliant support.

It is yet another purpose of the present invention to provide MEMS devices with improved drive voltage/gap trade-off.

It is yet another purpose of the present invention to provide suspension of MEMS devices without substrate contact which provides a simplified construction.

It is yet another purpose of the present invention to provide MEMS devices with unrelated wiring underneath the substrate.

It is yet another purposes of the present invention to improve an effective dielectric constant and the structure of the class of wiring structures which include a combination of wires, dielectric supports and air gaps.

The present invention is an air dielectric wiring structure and method of manufacture therefor. Successively formed wiring layers synergistically combine with interwire supports, either a subsequently formed sidewall or an improved planar layer, to form a self supporting air dielectric interconnection matrix.

Complex venting and plugging problems are avoided by using an easily removable dielectric, that can be virtually completely removed. Wires are supported by vertical sidewalls or an improved planar support layer in combination with wiring studs. An optional dielectric cladding may be left on the metal wires for short and oxidation protection. Because sidewalls or planar layers are formed after wiring, with the wiring at each level providing support definition, complex support alignment is unnecessary.

In one embodiment, sidewalls are formed after removing dielectric between the wires support and the otherwise free-standing wires. The sidewalls hold the wires vertically and connection between the successive perpendicularly aligned wiring levels interact to anchor each other. The dielectric wiring structure may include a thin dielectric covering, preferably of the same material as the sidewalls, that completely or partially covers the wiring and extends from each wire side down to lower levels of the air dielectric structure. The dielectric covering coats and protects the wires and anchors the wires in position. Thus, the incidence of shorting between wires in the air dielectric structure is reduced.

In the methods of manufacturing the air dielectric structure, after completing wiring layers for an integrated circuit, dielectric, preferably $SiO_2$ and possibly including nitride planar layers, is isotropically etched away in a pre-defined region, or anisotropically etched to a depth traversing at least a part of two or more wiring layers, leaving each wire on each exposed or partially exposed layer on or embedded within lengthwise $SiO_2$ pillars. A conformal layer of etch resistant (to $SiO_2$ etch) material is formed on the etched structure to form sidewalls at each $SiO_2$ pillar, ie., at the edges of each exposed or partially exposed wire. Alternately, the previously removed (by the etch) $SiO_2$ may be replaced with etch-resistant material filling between the wires. The remaining $SiO_2$ fill is removed through vents formed in the etch-resistant material.

In another embodiment, fill dielectric is anisotropically sub-etched away from the wiring layers by a first etch step, using the circuit wiring as an etch mask. The sub-etch traverses a portion of at least two orthogonally aligned wiring layers and terminates slightly before reaching an underlying etch resistant insulating material layer or at the layer, if the resistant insulating material layer is non-planar. A conformal layer of an etch resistant insulating material is applied. The structure is etched with an anisotropic etch to remove horizontal surfaces of the conformal coating and, especially to open the conformal layer at the bottom of the structure, thereby exposing the underlying fill dielectric. The exposed fill dielectric and all fill dielectric in contact with the exposed fill dielectric is then removed.

In one embodiment, the fill dielectric is silicon dioxide and the etch resistant insulating material is silicon nitride. The exposed silicon dioxide is etched using reactive ion etching (RIE) to a point above a silicon nitride layer. A thin layer of silicon nitride is then conformally deposited on the structure. A second anisotropic reactive ion etching step opens the silicon nitride and exposes the underlying silicon dioxide. A vapor HF etch is used to remove the remaining silicon dioxide until only the silicon nitride, the circuit wiring, or other etch resistant materials remain and are exposed to air. The result is an embodiment integrated circuit with air dielectric wiring having a thin silicon nitride layer stabilizing and holding the suspended wires in their original position.

In another embodiment, a permanent vented planar layer of dielectric is formed on the top of (overlying) each successive wiring layer. The top surface of the wires of each wiring level is made non-planar, prior to deposition of each permanent vented planar layer. Making the top surface of each wire non-planar offers the key advantage that the wiring, especially in long wiring runs to be more resistant to shear stresses than in prior art structures which include a planar layer which underlies the wiring and where the surface of the wire in contact with the planar layer is also planar. In an embodiment which has even greater resistance to shear stress, the sides of the wiring layers are tapered and/or the removable material which lies between the wires is further recessed below the top surface of the wiring prior to deposition of the vented planar layer. The removable material is removed through the vents after all of the wiring levels are formed. In fact, the vents can be formed after the completion of the wiring levels. An additional advantage of the invention is the placement of a planar layer over the top of the wiring rather than under the wiring. In this manner, the present invention is compatible with copper wiring formed by the "dual damascene" method where lines and studs are simultaneously formed and the wiring is patterned by Chemical Mechanical Polishing (CMP) after filling a trench in a dielectric with copper. The process of the present invention requires only a few additional steps to implement with copper wiring.

In another aspect of the invention, the air dielectric wiring is combined with micro-electromechanical (MEMS) devices. This aspect benefits from a hybrid of two embodiments described above. Sidewall support of the MEMS devices enables use of symmetrical parallel electrode structures where there is less susceptibility to residual stresses than previously obtainable. The hybrid design also enables easy, economical combination with copper wiring with an air dielectric. However, the resistance to stress in the sidewall supported MEMS is obtained whether or not the wiring elsewhere on the integrated circuit has an air dielectric. Accordingly, in yet another advantage of the present invention only minimal extra steps are required to form the hybrid MEM device.

When the present invention omits wiring down to the substrate when creating MEMS there is process and structure simplification. This facilitates construction of parallel freestanding structures which gives rise to an additional benefit, i.e., less susceptibility to interference from shock/acceleration, because both parallel structures are freestanding. For example, when one electrode (substrate) is fixed, then the substrate electrode and the freestanding electrode have differing response to forces which are felt by both the substrate and the electrode. Likewise, if the construction shapes are vastly different, then the responses will also be vastly different. If instead of one electrode being fixed to the substrate, both the electrodes can move and are symmetric, then there is addition benefit of reduced voltages required for a given deflection. Movement of both electrodes contribute to a change in relative position in contrast to when one electrode is fixed by the substrate. Then, relative motion must come from the single moveable electrode.

BRIEF DESCRIPTION OF THE DRAWINGS

The foregoing and other objects, aspects and advantages will be better understood from the following detailed description of a preferred embodiment of the invention with reference to the drawings, in which:

FIG. 11 shows an array of vent holes depicted in FIG. 11 along line 11a—11a;

FIG. 13b shows the formation of vents in the structure of FIG. 13a; and

FIGS. 14a–18c show the several steps of forming a transistor circuit/MEMS device of the present invention.

DETAILED DESCRIPTION OF THE PREFERRED EMBODIMENTS OF THE INVENTION

The inventor of the present invention discovered that gaseous HF may be used to remove silicon dioxide ($SiO_2$) from a layered wiring structure without the normal damage to the wires. The damage that occurred in prior art methods was the result of using an aqueous solution to remove fill dielectric. The prior art aqueous solution invariably attacked the metal wires as it removed the fill dielectric. Although gaseous HF has been used to remove thin reactive ion etch (RIE) residues from metal lines, it was heretofore believed that the long exposures necessary for oxide dielectric removal were similarly corrosive.

However, as the inventor has found, using gaseous HF, preferably at a partial pressure between 5 and 30 Torr, $SiO_2$ may be stripped completely away from a wiring structure, leaving the metal wires and studs behind unharmed. The gaseous reaction operates through formation of a thin aqueous film.

As a result of that discovery, the inventor further discovered that, in the microscopic world of these IC wires, other residual forces from stresses and strains introduced during construction overshadow gravitational forces. By removing the $SiO_2$ dielectric that normally encases long IC wiring runs, the freestanding wires are as likely to relax in a lateral or even an upward direction as in a downward direction, i.e., they will bow up, down or sideways.

Consequently, in the embodiment a gaseous material, preferably gaseous HF, is used to remove fill material, preferably $SiO_2$, encasing a wiring structure. As fill material is removed, sidewall supports are formed to hold the wires in place. Thus, structures formed according to the embodiment method have wires that are supported in all directions.

Figure 1:
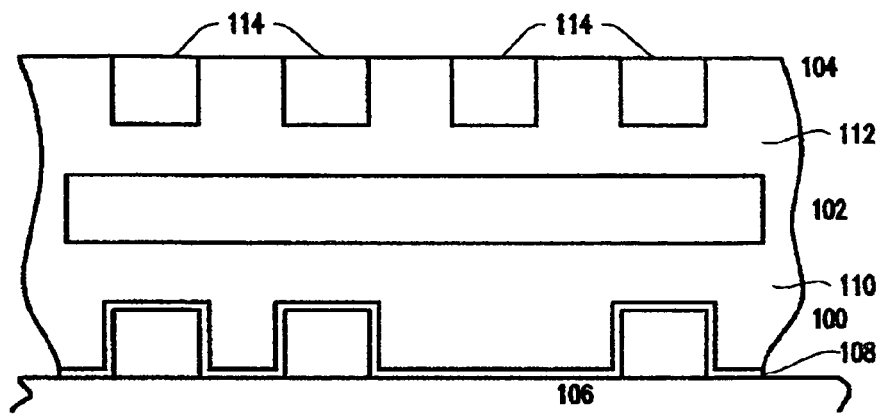
FIG. 1 is a cross-sectional view of wiring, which is preferably in an integrated circuit with three (3) wiring layers.

Referring now to the drawings, and more particularly to FIG. 1 which is a cross-sectional view of wiring, which is preferably in an integrated circuit with three (3) wiring layers 100, 102, 104. The wiring layers 100, 102, 104 are typically a metal such as aluminum or copper. The air dielectric wiring structure, which is formed from the structure of FIG. 1 may be limited to a specific area of a chip or may encompass an entire chip.

Although generally referred to herein as metal wiring surrounded by an air dielectric, the present invention may be applied to any microstructure that is desired to be freestanding, or entirely unsupported by underlying material layers. Further, as described herein, the air dielectric structure is shown as being formed in metal wiring layers 100, 102 and 104. However, an air dielectric structure may extend above and below layers 100, 102 and 104 and throughout the layers of an integrated circuit chip with a bottom layer being a polysilicon gate layer.

Thus, to form an air dielectric structure, first wiring layer 100 is formed above a semiconductor body 106 which may be a silicon substrate or the surface of an insulator layer in, for example, a silicon on insulator (SOI) wafer. After forming the first wiring layer 100 according to any well known process, a thin etch resistant layer 108, preferably silicon nitride or diamond-like crystallized carbon, is formed on the wiring layer 100, at least in an area where a preferred air dielectric structure is to be formed. A first fill material layer 110, e.g. an oxide layer, is formed on the thin etch resistant layer 108. The second wiring layer 102 is formed on the first insulating layer 110. A second fill layer 112 is formed on the second wiring layer 102. The second fill layer 112 is of the same type of fill material as in the first 110. The third wiring layer 104 is formed in the second fill layer 112 using a damascene process where metal is formed by: a) etching channels in layer 112; b) filling the channels with metal; and, then c) polishing the metal off the top of the insulator to leave it in the channels 114. Alternately, the third wiring layer 104 may be formed on the second fill layer 112 with fill material formed over the third wiring layer 104 to fill between the wires 114 in the third wiring layer 104.

Figure 2:
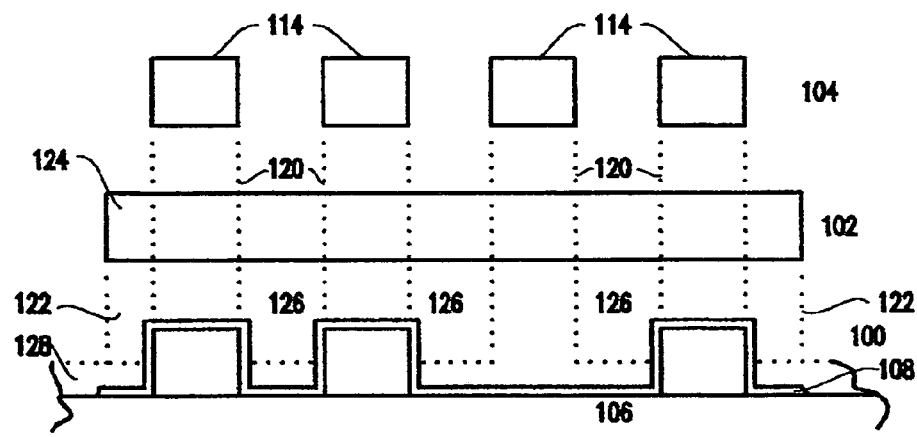
FIG. 2 shows the structure of FIG. 1 etched, with the wiring layers serving as masking layers to remove fill oxide from between wires and, thereunder, from fill layers.

Next, in FIG. 2, the structure of FIG. 1 is etched, preferably using an anisotropic reactive ion etch (RIE) with the wiring layers 100, 102 and 104 serving as masking layers to remove fill oxide from between wires 114 and, thereunder, from fill layers 110 and 112. The anisotropic RIE continues until the thin etch resistant layer 108 on the semiconductor body 106 is exposed or nearly exposed. The RIE leaves walls 120 standing beneath wires 114 and walls 122 beneath wires 124 on the second metal layer 102. By ending the RIE prior to re-exposing all of thin etch resistant layer 108 in spaces 126, a thin insulating layer 128 remains.

Further, to protect the topmost wiring layer from attack during RIE removal of the fill oxide, a patterned resist material layer having the same pattern as the topmost wiring layer may be added to protect the upper wiring layer. Thus, for example an upper aluminum wiring layer may be protected using the same resist used to define the metal. Thus, immediately after patterning the metal, and before stripping the photoresist, the oxide is removed in a RIE step.

Figure 3:
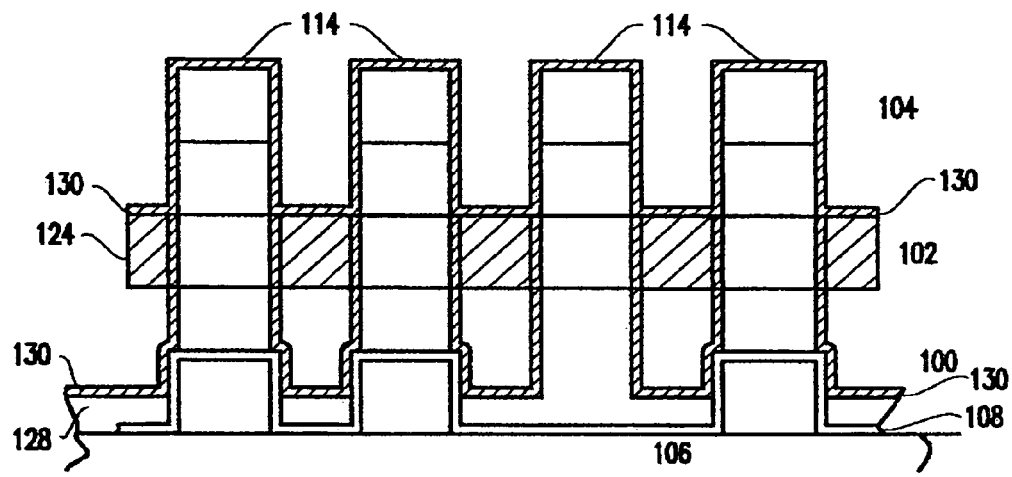
FIG. 3 shows a conformal layer of etch resistant material is formed on the structure of FIG. 2.

Next, in FIG. 3, a conformal layer 130 of etch resistant material is formed on the structure of FIG. 2. Preferably, the etch resistant material is silicon nitride. The conformal layer 130 coats the top and side of third wiring level 104, the top and side of the regions of second wiring level 102 that were not masked by third wiring level 104, the top and part of the side of wiring level 100, not masked by 102 or 104 and the sides of oxide walls 120, formed during the anisotropic RIE etch.

Figure 4:
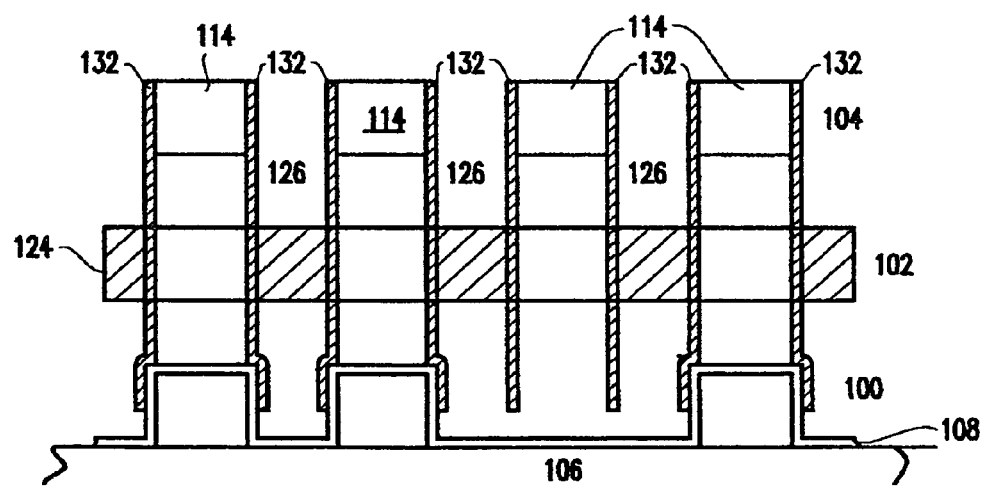
FIG. 4 shows horizontal portions of conformal layer removed to leave sidewalls.

Horizontal portions of conformal layer 130 are removed using an appropriate anisotropic RIE, leaving sidewalls 132 in FIG. 4 and re-exposing the remaining thin fill layer 128. This re-exposed thin fill layer 128 provides an access to all or nearly all of the remaining fill material. The fill material, which is preferably $SiO_2$, must be etchable using gaseous HF, preferably at a partial pressure between 5 and 30 torr, with high selectivity to the metal in metal layers 100, 102 and 104 and to the sidewall material. Further, it must be removable both by an anisotropic etch, and by an isotropic etch.

An isotropic etch using gaseous HF removes all of the remaining accessible fill material through the accesses, i.e., all fill material between sidewalls 132 under wiring layers 102 and 104, as well as layer 128, leaving behind a honeycomb-like sidewall structure. Thus, virtually all of the fill material is removed, leaving behind the wires in layers 100, 102 and 104 held in place by the honeycomb-like sidewalls 132. The synergistic matrix of interconnected wires and sidewalls so formed is self supporting.

It is important to note that for preferred embodiment wiring, sidewall pedestals between wiring layers need not be aligned throughout the resulting multilayer structure. It is only necessary that each sidewall pedestal rest on or support either another sidewall pedestal or a previous/subsequent level wire. Furthermore, it is unnecessary that each sidewall pedestal align with a sidewall pedestal in adjacent layers. It is only necessary that each sidewall pedestal intersect with another sidewall pedestal in an adjacent layer. A thin, sub-lithographic layer of dielectric material sidewall may both sufficiently support the wiring and partially coat the wires with dielectric (protecting them from shorts) without requiring extra masks. As a result a large percentage of volume of the final structure is air.

The sidewall pedestals may rest on and be supported by studs of an underlying wiring level, or by a stiff overlying layer, or some combination of the two. If the sidewall pedestals do contact an underlying substrate it is advantageous that they contact a non-planar substrate, so that the sidewall pedestals do not seal in the removable fill material, i.e., the $SiO_2$ pedestals.

The resulting structure is shown in FIG. 4. There is no oxide between metal levels 100, 102 and 104. A thin nitride sidewall 132 is shown between metal lines 114. There is a thin nitride sidewall along certain portions of wires in layer 102 (i.e. those not masked by lines 114), and thin vertical nitride plates (coplanar with the sidewalls of metal lines 114) join orthogonal vertical nitride plates at wiring layer 102. Although these nitride sidewalls have a higher effective dielectric than air, they provide needed vertical and lateral rigidity, holding the wires against any lateral motion.

Although the method of the preferred embodiment may be used to form a single suspended wire, preferably it is used to form multiple levels of wires in a complex structure. Increased rigidity and improved electrical insulation also prevents shorts from deformed wiring observed with prior art freestanding wire.

The final etch in the embodiment is an isotropic oxide etch which must etch oxide with high selectivity to the metal lines and the nitride masking layers and, further, through channels with a very high aspect ratio. The worst case aspect ratios encountered are when directionally oriented wiring layers align and have the same pitch, e.g. layers 100 and 104 in FIG. 4. In such a case, if there are no wires on wiring level 102, then the length of a high aspect ratio channel being etched is as long as the wires run aligned on the two levels. For this case, HF vapor is sufficiently selective and penetrates these high aspect ratio structures adequately. In general, however, most channels will have much lower aspect ratios because wiring layers will not have the same wiring pitch and so, will not be in registration with each other.

In an alternate embodiment wiring layer 100 is formed in an undoped oxide. Fill layers 110 and 112 at wiring layers 102 and 104 are doped silicon dioxide such as phosphosilica glass (PSG). Since vapor HF etches PSG with high selectivity to undoped silicon dioxide, in this embodiment etch resistant nitride layer 108 may be eliminated. After stripping PSG, stripping ends at the underlying undoped silicon dioxide, making nitride layer etch resistant layer 108 unnecessary.

Further, although nitride is the preferred etch resistant material for sidewalls, other suitable materials, such as diamond or diamond-like carbon which is resistant to etching by vapor HF, and has a low dielectric constant may be used as well. A suitable sidewall material must be an electrical insulator capable of forming along sidewalls, providing structural support, and must be etch resistant to the etch used to remove the fill material when form the air dielectric.

In a second alternate embodiment, the fill material is silicon and the sidewalls are formed by oxidation of the silicon. After silicon oxidation, the remaining underlying silicon may be removed with an isotropic, wet etch using, for example KOH or pyrocatechol. Optionally Chemical Dry Etching (CDE) or another appropriate dry etch may be used to remove the silicon.

In yet another alternate embodiment, the fill material is removed by dissolution. Using, for example, a damascene process to define metal patterns directly in a layer of photoresist, the photoresist is anisotropically etched with the metal lines as a mask. Then, a sidewall is deposited. The bottoms of the sidewall are etched using a RIE. Then, the remaining photoresist is removed with a solvent. Alternately, a downstream or other plasma source may be used to remove the residual photoresist. Further, the fill material may be a water soluble inorganic, such as boron or germanium oxides. Many organics and inorganics can be easily removed by evaporation or thermal decomposition. Thus, making the fill material of such an organic or inorganic material, it may be removed by thermal decomposition or by evaporation.

Figure 5:
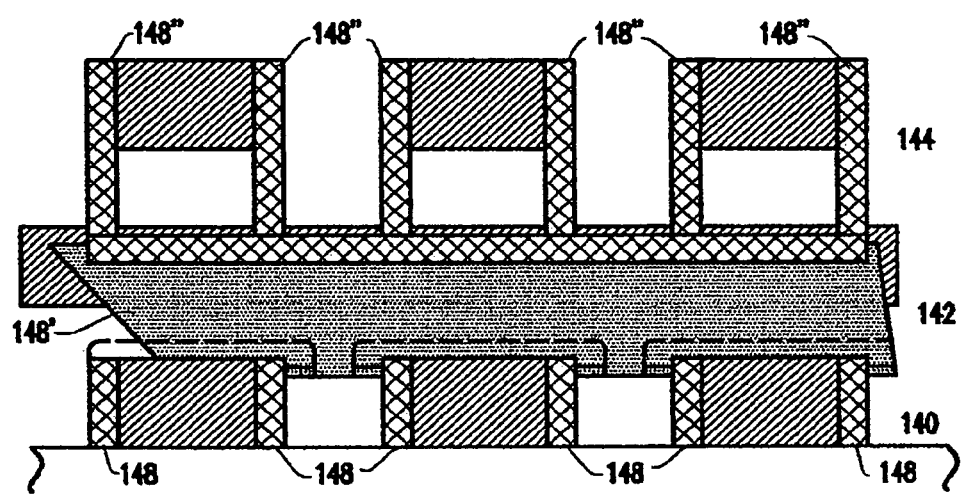
FIG. 5 shows an alternate embodiment wherein to minimize exposing the wiring layers to oxide RIE, the sidewall layer is formed stage by stage as each wiring layer is formed.

Alternately, to minimize exposing the wiring layers 100, 102 and 104 to the oxide RIE, the sidewall layer may be formed stage by stage as each wiring layer is formed as represented in FIG. 5. In this embodiment, each wiring layer 140, 142 and 144 masks oxide during RIE down to the next, lower wiring level. Further, as provided above, photoresist from patterning the wiring layer 140, 142 and 144 may be left on the wiring pattern to protect it during the RIE. In this alternate embodiment, sidewall pedestals are present along the entire length of each wire at each level and so, are present in areas that were masked by overlying wiring patterns in the preferred embodiment. These extra sidewalls form because sidewall layers are formed as each wiring layer is formed instead of deferring sidewall layer formation until the last wiring layer is formed.

Although each stage is described as a wiring layer, it is contemplated that a stage may be two or more layers and that the individual stages may each be different multiples of wiring layers. Thus, the first layer 140 of layered metal structure is formed of a conductive material such as aluminum, copper or the like, and patterned by any typical method. In this embodiment, the wiring layer 140 or a resist cap (not shown) on the wiring layer 140 acts as a RIE mask. With the wiring layer as mask, fill material is removed from between the wire patterns.

A conformal sidewall layer 148 is deposited on the stripped wiring layer 140 and anisotropically etched to remove horizontal portions of the sidewall layer (not shown). A fill material is deposited to fill spaces between sidewalls, forming a planar surface. Each subsequent via or wiring layer, e.g., layers 144 and 146, is formed by repeating these steps, i.e., pattern wiring, RIE to strip fill down to the next lower wiring layer, deposit a conformal layer 148' and 148", anisotropic RIE to remove horizontal conformal layer portions and deposition of interlayer dielectric. After forming all metal levels, the remaining fill is removed using a vapor HF process as described in the above embodiment.

Figure 6:
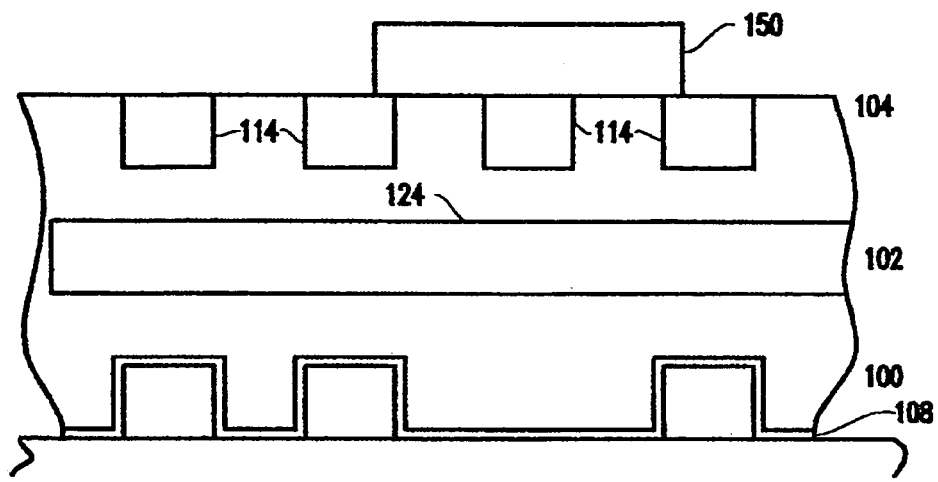
FIG. 6 shows another alternate embodiment wherein dummy sidewalls provide extra structural support and the conformal layer may be vented at a top surface using CMP.
Figure 7:
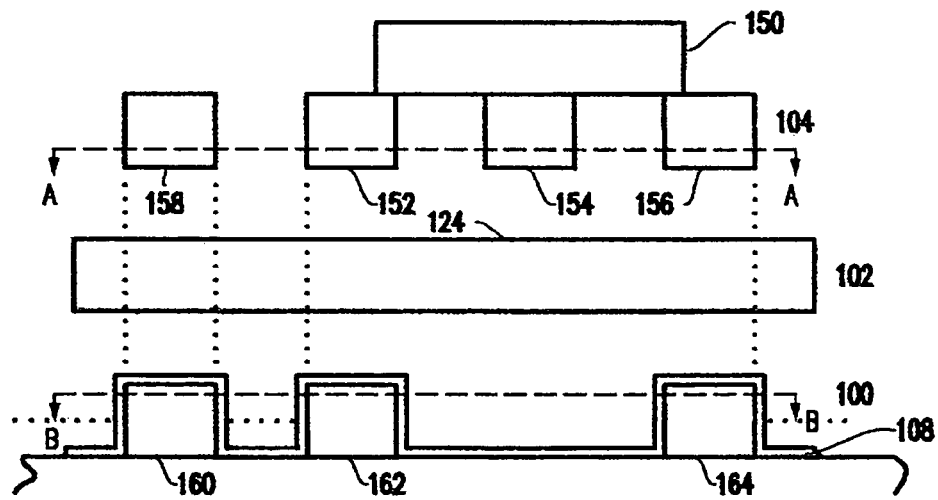
FIG. 7 shows after anisotropically etching the alternate embodiment of FIG. 6 wherein a resist pattern is transferred to the fill dielectric which is further patterned by wiring layers.

In another alternate embodiment shown in FIG. 6, an etch resistant pattern 150 may be formed over the upper metal wiring layer 104 to form a dummy sidewall pattern above wires 152, 154 and 156 of FIG. 7, leaving wire 158 exposed. In this embodiment, the dummy sidewalls provide extra structural support and, if the fill material is removed using chemical mechanical polishing (CMP) instead of RIE, pattern 150 provides a vent at the top surface. The resist pattern may be an anisotropic etch-resistant material or a resist pattern transferred in a different etch resistant material such as silicon nitride. Optionally, the etch resistant pattern 150 may be formed of an etch resistant material overlying an additional layer of removable material.

Next, in FIG. 7, after the anisotropic etch, the pattern defined by resist pattern 150 is transferred to the removable dielectric further patterned by wiring layers 100 (wires 160, 162 and 164), 102 and 104. In this alternate embodiment, a number of sides are removed that had remained in the above described embodiment. In particular the sides that are masked by resist pattern 150 are not formed.

In this embodiment, after the anisotropic etch, a conformal sidewall material is deposited as in the above embodiment. Sidewall material may be deposited before or after removing the patterned etch resistant material 150. For this embodiment, the conformal sidewall layer may be vented either: by an anisotropic etch removing portions of the conformal layer from horizontal surfaces, as described hereinabove or, by using CMP to polish portions away from the upper horizontal surfaces. Optionally, if the topmost surface of the region protected by the resist mask 150 may be polished down to expose removable material; then, CMP may be used to form a vent by removing the top surface until underlying removable material is exposed.

Figure 8A:
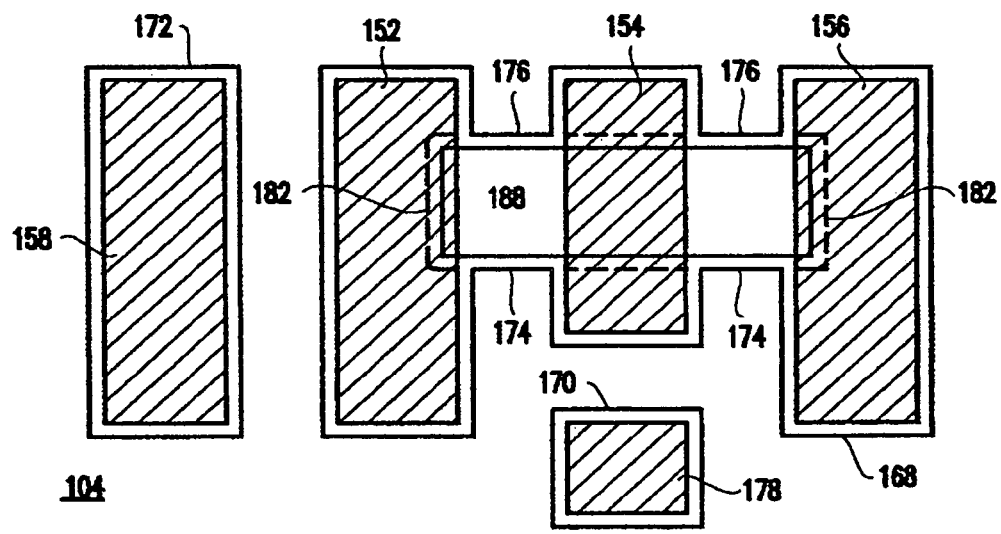
FIG. 8A is a top view of the wiring and the sidewall formed at the top wiring layer of FIG. 7.
Figure 8B:
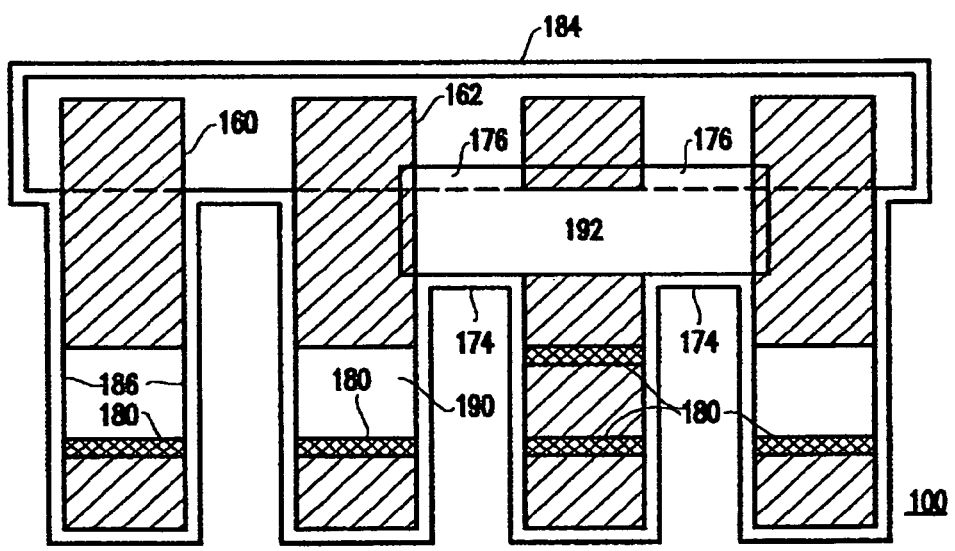
FIG. 8B is a top view of the wiring and the sidewall formed at bottom wiring layer of FIG. 7.

FIG. 8A is a top view of the structure of FIG. 7 through A—A, showing the wiring and the sidewall formed at wiring layer 104. FIG. 8B is a top view of the wiring and the sidewall formed at wiring layer 100 of FIG. 7 through B—B, showing sidewall 184 formed as a result of masking from overlying metal line 124 in metal layer 102. Sidewalls 184 extend down from the wiring layer 102 down to wiring layer 100 and are freestanding at wiring layer 100 and unattached to wiring layer 100. Regions 174 are defined by resist pattern 150, and attach adjoining wires in layers 100 and 104. Sidewall regions 176 are defined by resist pattern 150, and are attached to wiring layer 104, but terminate at the top of wire 124. Sidewall regions at the upper ends (in FIG. 8A) of wires 152–158 are defined by wiring layer 104 (wires 152–158) and terminate at the top of wire 124 in wiring layer 102. Sidewall regions at the lower edges of wires 152–158 and the upper edge of wire 178 are defined by wiring layer 104 and extend down to and terminate at the top of wiring layer 100 in regions 180.

An additional sidewall 182 extends upward from the top of wiring layer 104 and is present only if the resist pattern 150 is present before the conformal layer is deposited. In this case, sidewalls 174, 176 also extend upward from the top of wiring layer 104. Sidewalls 176, 174 provide additional lateral support for lines on wiring layer 104. Sidewalls 174 and 184 provide extra lateral support for lines on wiring layer 100. Sidewall 184 is defined by a metal line 124 on wiring layer 102 and is freestanding at layer 100. Sidewall 184, along wiring layer 102, as well as wiring layer 102 itself provide lateral support to wire 158. Lateral support to line 124 is provided by intersection with sidewalls from lines 152, 154, 156 and 158 in overlying layer 104.

When removing the fill dielectric, the fill dielectric under line 158 on wiring layer 104 is vented from wiring layer 100 between the freestanding sidewalls 186. Line 152 is vented from regions 190 and 192 in layer 100 and region 188 at the upper wiring layer 104. While in this example the dielectric under line 178 would not be vented, this can occur only if there is overlapping wiring of the same pitch and features.

Figure 9:
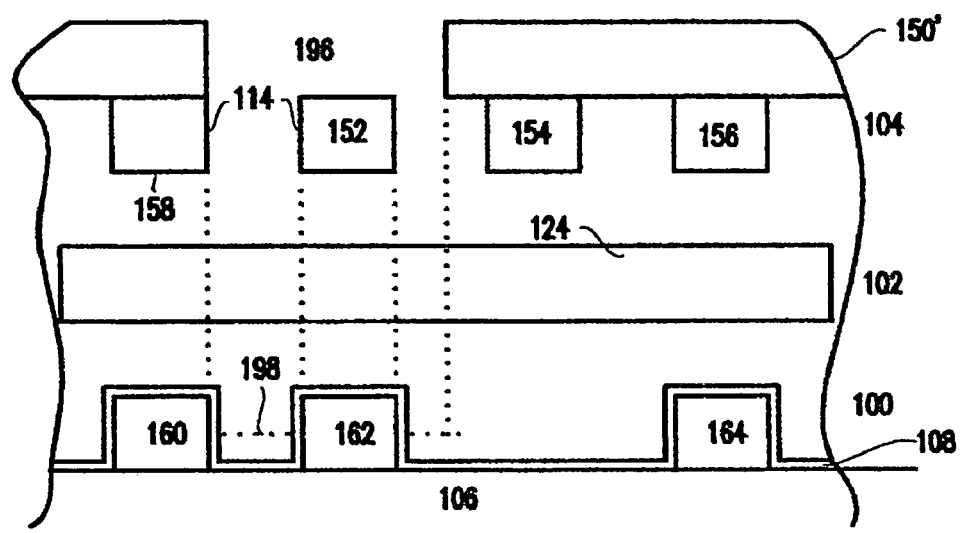
FIG. 9 shows a variation on the alternate embodiment in FIG. 7, wherein the surface is masked by resist and supports are formed only in small unmasked regions.

In a variation on this alternate embodiment, as shown in FIG. 9, most of the surface is masked, instead of small localized regions and selected areas 196 are opened through a mask 150' layer. Preferably, an anisotropic etch is used to open the openings 196. The etch resistant layer 150' may be a composite layer, such as an oxide, nitride, photoresist combination. The structure of FIG. 9 may be coated with a conformal layer, or may be filled with a non-removable material. The mask is vented or removed at the top surface by patterned RIE or CMP before removing the fill material. Alternatively, if the fill opening 196 is coated with a conformal layer, then, anisotropic etching will open vents in region 196 at 198. If etch resistant layer 150' is an oxide fill-nitride composite and the vents are plugged after the oxide fill is removed, then the nitride sublayer of etch resistant layer 150' forms a sealed layer, suspended above the entire wiring structure.

Thus, the methods of the present invention define supporting sidewall pedestals after the wiring is defined. The sidewall pedestals are etched by techniques that leave wiring substantially intact and are formed after the wiring is formed on or in a removable dielectric. If a directional etch is used to define the sidewall pedestals, then wiring acts as a mask to underlying removable material, and the sidewall pedestals are mainly to the side of the supported wires.

Further, the preferred removable dielectric is silicon dioxide, widely used in integrated circuit devices. Thus, the present invention does not require extensive process development that might otherwise be required when using completely new combinations of metal, dielectric, and sidewall. The present invention adds only an oxide RIE step, a sidewall deposition step, sidewall RIE open, and dielectric removal step to well known integrated circuit fabrication processes. With the possible addition of an optional step of including a single buried nitride layer to block vapor HF from attacking underlying silicon, these additional steps may all occur after the circuit itself is complete. Thus, the present invention is based on well known techniques of building wires in $SiO_2$ that are not available in using completely new structures with dielectrics such as parylene that lack capability of deferred dielectric removal.

Figure 10:
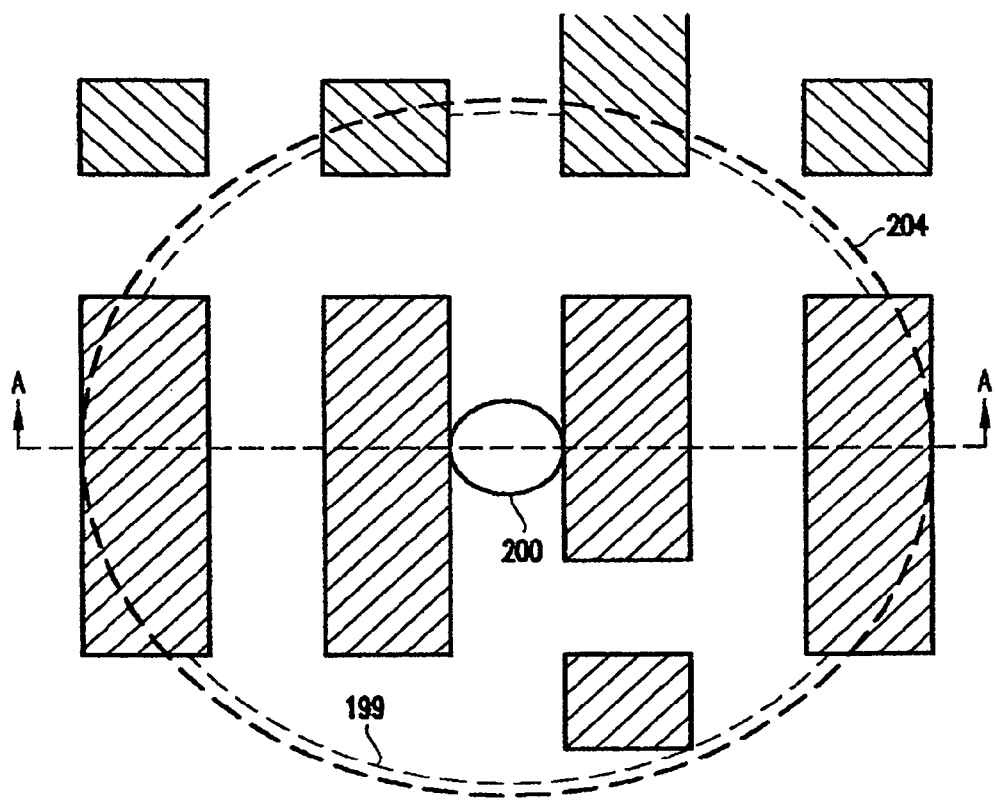
FIG. 10 shows a top view of another alternate embodiment wherein, instead of using an anisotropic etch, an isotropic etch is used to form the wiring supports.
Figure 11:
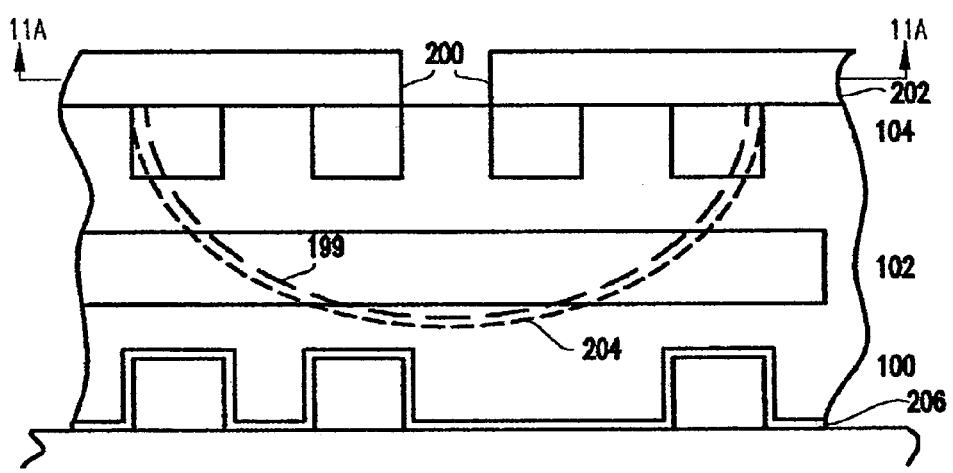
FIG. 11 is a cross-section of the embodiment of FIG. 10 at A—A.

FIG. 10 shows a top view of another alternate embodiment wherein, instead of using an anisotropic etch, an isotropic etch is used to form the wiring supports. FIG. 11 is a cross-section of the embodiment of FIG. 10 at A—A. In this embodiment, a small opening 200 (which may be one opening in an array of such openings) is defined through a layer of isotropically etch resistant material 202. Fill dielectric ($SiO_2$) is removed to just below the next underlying layer 102 or deeper, as represented by dotted line 204. Non-planar continuous layer 206 is a layer of material or layered material that is impermeable to whatever etchant is used to remove the fill material.

A conformal sidewall layer 199 may be formed before or after removing resist or etch resistant layer 202. Alternatively, the space left by fill material removal may be filled with etch resistant material. Vents may be opened in the sidewall layer (not shown) at the bottom of space 204 using a RIE to allow fill material removal. Alternatively, CMP or RIE may be used at the upper surface to open vents. Venting may be done using isotropic etching, anisotropic etching or combinations thereof. An isotropic etch is then used to remove any remaining fill material.

A more detailed description follows. After fill, or removable interlevel dielectric is removed to dotted line 204 of FIGS. 10 and 11, the capping layer 202 is removed and the previously optional sidewall 199 is deposited as a liner in the hemisphere. FIGS. 10 and 11 show the liner on perimeter 204. Depending on the technique used to form the liner, such as a conformal chemical vapor deposition or a less conformal plasma enhanced CVD, there will be some liner (not shown) deposited on the metal lines as well. The same removable fill material is redeposited in the lined trench, it is planarized by CMP and a capping layer of etch resistant material is redeposited and vented by RIE through a patterned mask (which is removed) as before to yield a layer similar to layer 202. The structure is very similar to that described in FIGS. 10 and 11, but the sidewall 199 is present and vents, not shown, also vent the removable fill material on the other side of the sidewall material 199. Now, when the removable material is removed, the removable dielectric on both sides of sidewall 199 is removed. The vents in etch resistant layer 202 can then be filled to yield a finished wiring structure with air dielectric.

Optionally, in any of the above embodiments, dummy wires may be selectively included with the circuit wiring to provide additional wiring support. Further, not all of the fill material may be removed. Some material may be left behind for added strength, while some is removed for wiring improved capacitance.

Figure 11A:
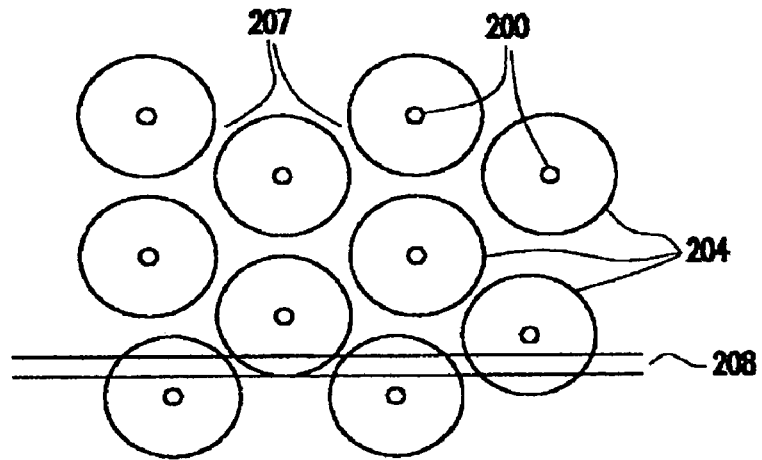
FIG. 11b shows the array of vent holes having overlapping etch fronts.
FIGS. 11c and 11c show wiring supported by permanent and removable dielectrics such that the permanent dielectric is removed in portions where the removable dielectric is removed.
Figure 11B:
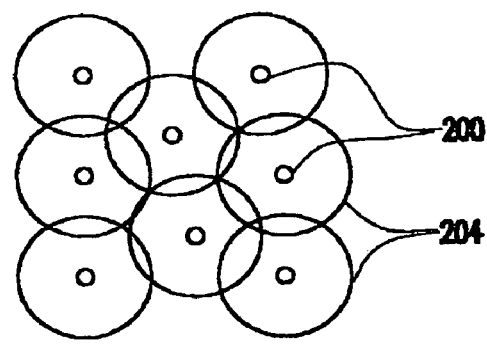

FIG. 11a and FIG. 11b show an array of vent holes depicted in FIG. 11. If an array of vent holes 200 as in FIG. 11a are used and plugged following the isotropic etch, then the result will be a partial air dielectric structure with an array of hemispherical voids, with the uppermost etch front designated by the boundaries 204, surrounded by the remaining removable dielectric 207. This remaining dielectric pillar provides support walls for the wires, (not shown) which partially or fully span the hemispherical voids. A wire 208 is shown passing though the array of hemispherical voids. It should be understood by those skilled in the art that even if the uppermost etch front 204 of the array of holes 200 overlap (FIG. 11b), the metal layers underlying the topmost layer will still be supported by remaining removable dielectric 207. Note that the voids are hemispherical if there is little etching beyond layer 202 during anisotropic etching of the vent holes 200. However, if an anitsotropic etch extends deeply into the underlying interlevel dielectric to the area of the layer 100, the subsequent isotropic etch will produce a void which is more cylindrical.

A wide range of shapes can be etched by a combination of shallow RIE or deep (see description of FIG. 13a) multilayer anisotropic RIE etching of vent holes with a following isotropic etch, to produce hemispherical or cylindrical etched regions; by combination of deep RIE of larger openings as in FIG. 9 with a following isotropic etch; and by altering the location and density of the array of openings shown in FIGS. 11a and 11b. If an oxide with a high etch rate is selected for a particular layer, then the etch radius of this layer will be greater than for the other layers.

Figure 11C:
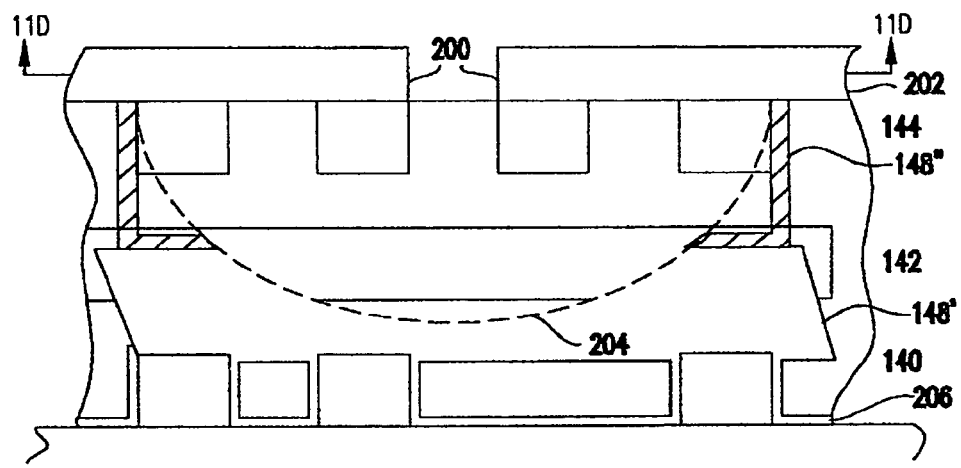
Figure 11D:
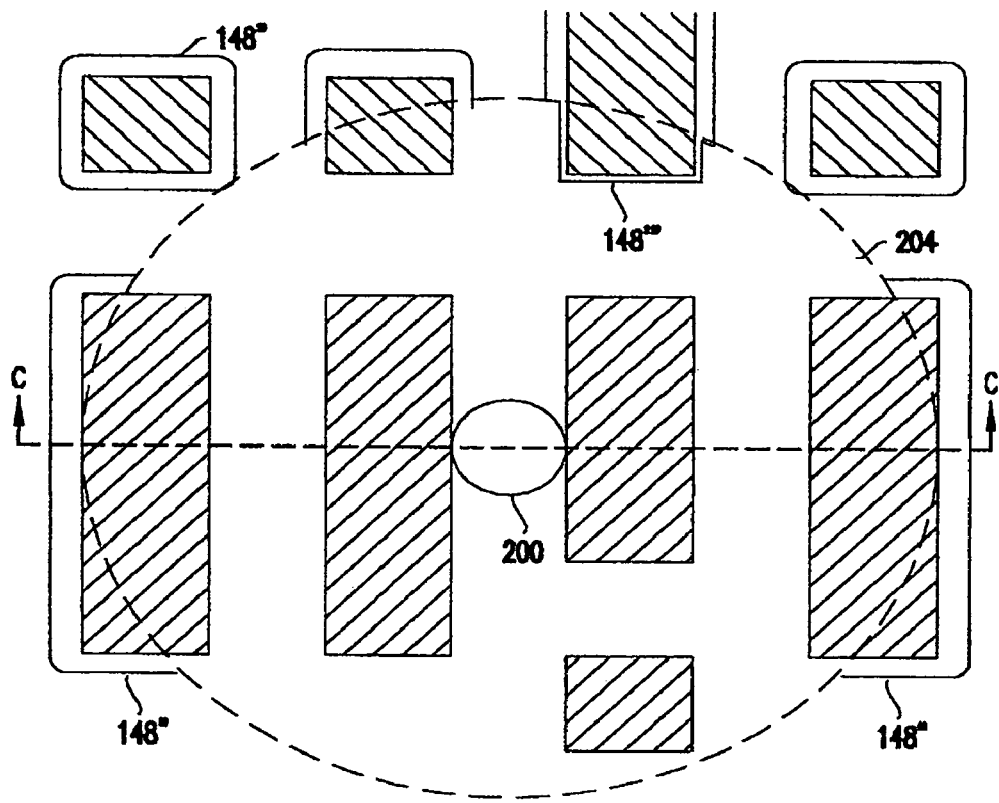

Dielectric structures can be improved by a variation of the method described above. By way of example, consider the structure of FIG. 5 before any removable dielectric is removed, and after any removable dielectric is planarized to be planar with the top of metal level 144. This consists of wiring levels which are supported by sidewalls 148", 148' and 148 made of a permanent layer which is resistant to a method used to remove the removable dielectric. An etch resistant layer 202 is patterned with opening 200 as described in the description of FIGS. 10 and 11. An isotropic etch is used to etch a roughly hemispherical region of the removable dielectric, exposing regions of sidewalls 148" and 148'. An isotropic etch which selectively etches the sidewall then removes the sidewall from the hemispherical region to yield the structure of FIGS. 11c and 11d. The same etch which formed the hemisphere is then used to remove the remainder of the removable dielectric to leave a sidewall supported structure outside the original hemisphere. Improvement in effective dielectric constant is obtained even if the sidewall is only partially etched or thinned inside the hemispherical etched region as shown in FIG. 11d, 148'''.

An alternative method is to form the hemisphere or to etch to completion (complete removal of the removable dielectric) with an etch which also attacks the sidewall, but at a reduced rate. The regions of sidewall exposed the longest will be removed or thinned the most.

Moreover, there is a whole class of prior art and yet to be conceived structures which combine wiring, air gaps or air dielectric, and dielectric supports. There will exist in each of these structures, as applied to actual circuitry, at least some regions where the dielectric supports can be removed (as described above), reduced in size, or reduced in number by etching without causing a detrimental effect upon overall support of the wiring structure. Such a reduction in dielectric support will result in a favorable reduction in the effective dielectric constant for the wiring of the circuit and corresponding increase in circuit performance and/or reduction in power dissipated within the circuitry. Intermixing some regions having increased support of wires amongst other regions having reduced support enables using increased support of wiring in a region where it is needed without increasing the effective dielectric constant in regions where support is not needed.

In the above-described embodiments, the region to be etched is defined by etching through a small vent to produce a hemispherical region if the etch resistant layer 202 is just opened by RIE; however, the etched region will be cylindrical if the RIE proceeds deep into the underlying dielectric, or of arbitrary shape if the unmasked RIE etched region of FIG. 7 or 9 is followed by an isotropic etch which removes the dielectric masked by metal lines. After removal of the resist or etch resistant layers 202 or 150, the structure can be (optionally) coated with a non-removable sidewall, backfilled with a removable or non-removable dielectric, a non-removable capping layer added which is vented, and the removable dielectrics removed a second time. The backfilled removable dielectric can be the same as or different from the original removable dielectric.

In some respects an etch region which is a section of a hemisphere, as in FIG. 11, or a distorted, stepped section of more than one hemisphere (FIG. 13b) is an advantageous shape. These shapes are of greater etched volume at upper wiring levels. It is precisely these wiring levels which have the longest wire runs and the greatest need for reduction in the effective dielectric constant.

The support dielectric in the etched region can be etched by the same isotropic or anisotropic etch used to define the etched region, or by a separate isotropic etch. For instance, in the supported air dielectric wiring structures of FIGS. 1–9, if the original removable dielectric is silicon dioxide and the non-removable, support dielectric is diamondlike carbon, then the silicon dioxide is removable by a vapor HF etch in a defined region and the diamondlike carbon support dielectric in that defined region can be attacked and reduced in thickness or etched entirely by an oxygen plasma.

Alternatively, in the supported air dielectric wiring structures of FIGS. 12 and 13, if the original removable dielectric is silicon dioxide and the non-removable, support dielectric is silicon nitride, then the nitride layer and silicon dioxide layer can be removed by RIE in a defined region where it is not masked by overlying metal lines. Back filling with silicon dioxide, polishing the oxide, capping, venting, then removing the silicon dioxide selectively to nitride with a vapor HF etch will leave a structure in which the metal line masked nitride layer will provide a reduced support dielectric in the defined region. The support nitride layer is planar, continuous, and not reduced outside the defined region, wherever the nitride was masked by photoresist during RIE. In each case the wiring structure is supported by a dielectric with the wires extending from within the etched region which has reduced dielectric supports to the other side of a non-etched perimeter region and where the support dielectric was not reduced by the etch.

Figure 12A:
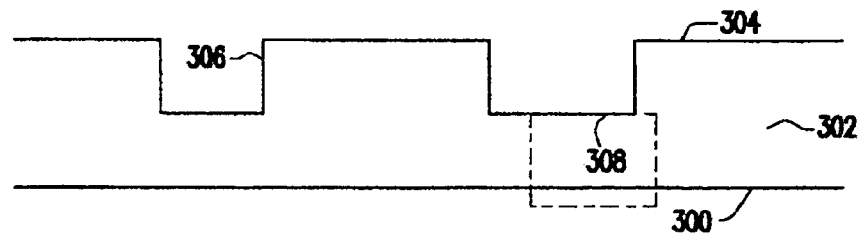
FIGS. 12a–12c shows a structure and method of forming an alternative embodiment of the present invention having a convex surface over the wiring layer.

FIGS. 12a–12d show a structure and method of manufacturing an alternative embodiment of the present invention having a convex layer (or other non-planar layer) over the wiring layer. Referring to FIG. 12a, any initial wiring layers reside below the surface 300. A layer of removable dielectric layer 302, for example, silicon dioxide, is deposited on surface 300 to form a new surface at level 304. Trenches 306 and via trenches 308 are formed in the dielectric layer 302 by, for example, patterning a layer of photoresist (not shown) then Reactive Ion Etching (RIE). The via trenches 308 extends through any dielectric layers which extend below the surface 300, and down to underlying structures which require electrical connection. In particular, if there are previously formed wiring layers underlying surface 300, the via 308 will reach an underlying wiring layer by penetrating a dielectric layer analogous to layer 316 (of FIG. 13).

Figure 12B:
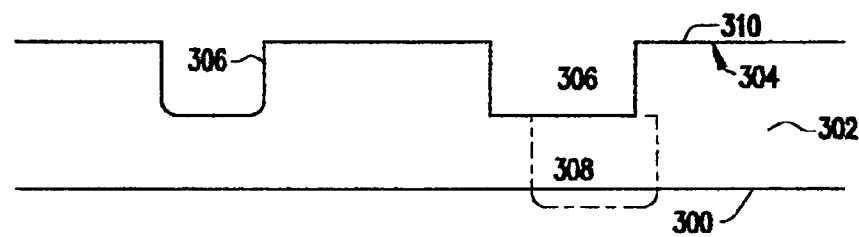
Figure 12C:
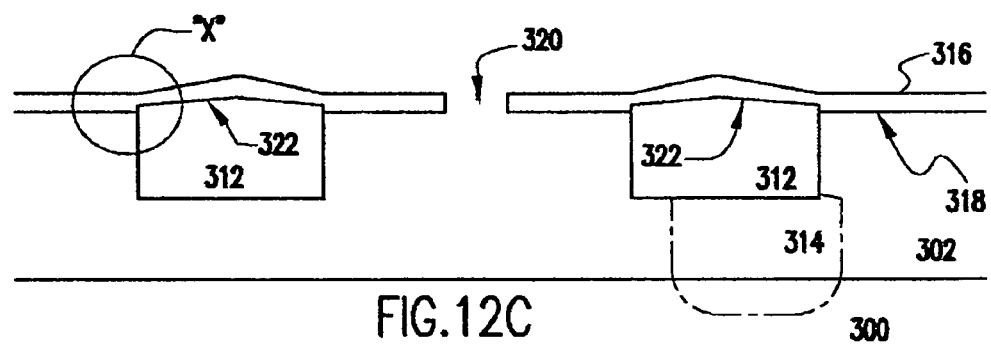

FIG. 12b shows a layer of metal 310, preferably copper, which is electroplated after removal of photoresist, and after sputter deposition of a continuous metal liner into the trenches 306 and via trenches 308 and onto the surface 304. The copper layer 310 and any metal liner is then polished off surface 304 by CMP to produce metal lines 312 and studs 314 from the original trenches 306 and vias trenches 308. As seen in FIG. 12c, if the layer 310 polishes at a lower speed than the dielectric layer 302, then over polishing will produce a metal line 312 (one of many metal lines of the wiring layer) and stud 314 with a top convex shaped surface 322. If the layer 310 polishes at a higher speed than the dielectric layer 302 then over polishing will produce a concave top surface of metal lines 312 (shown as dashed line 322a).

As shown in FIG. 12c (and FIG. 12d), the topmost surface of dielectric layer 302 will lie below the original level 304 of FIG. 12a after polishing. Optionally, the surface of dielectric layer 302 can be further recessed by RIE, Chemical Downstream Etching, or wet or dry HF etching to level 318 of FIG. 12c. Referring still to FIG. 12c, the planar layer 316 (such as silicon nitride which is not significantly attacked when dielectric layer 302 is later removed) is deposited and then a vent 320 is defined by photoresist and etched away. If the wiring layer is the topmost wiring layer, the dielectric layer 302 is removed through the vent 320. After removal of the dielectric layer 302 in the region shown and in underlying layers, the entire structure is supported by the planar layer 316, the wiring 312, and the stud 314, the latter which connects downward to any wiring and planar layers which may lie beneath surface 300.

Figure 12D:
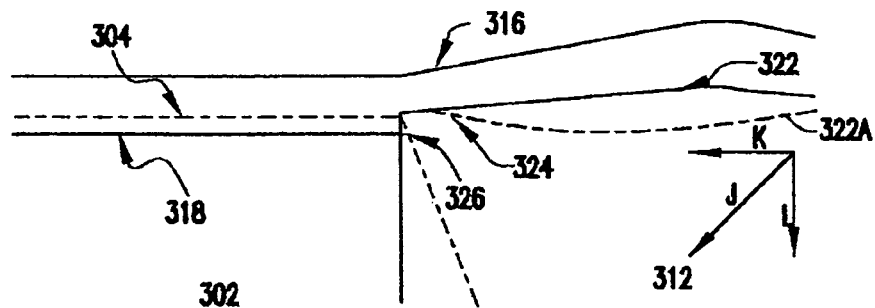

FIG. 12d shows an exploded view of the corner of the wiring which is circled in FIG. 12c and represented by "X". A force vector J (from residual stresses in the structure) is shown resolved into components parallel, K, and perpendicular, L, to the planar layer 316. The planar layer 316 follows the convex curvature of the wire 312. This curvature is formed when over polishing removes the oxide material 302 more rapidly than the metal 312. It is noted that the over polishing lowers the oxide surface, thus increasing the pressure of the polishing pad on the corner region 324 of the metal line 312. The additional pressure in the corner 324 erodes the metal line 312 faster in the corner and leads to a convex top surface 322. A concave non-planar surface 322a would be formed if the metal polished faster than the oxide. An optional additional etch further lowers the oxide surface to level 318. Clearly the line so formed is more resistant to detachment from force vector K than a line which has a planar attachment to layer 316 and no recess of the oxide between metal lines.

The metal lines 312 shown in FIG. 12c are also less resistant to detachment from force vector L; however, the line is more resistant to detachment from force vector K. It is noted that the metal line 312 is more resistant than would be a line with a planar attachment to layer 316 because the convex surface 322 has a greater attachment area than a flat, planar surface. The vents of FIG. 12c can be constructed on a layer by layer basis as the wiring is formed; however it is preferable to form the vents after the entire multilayer wiring structure is formed.

Although FIGS. 12a–12d show metal lines 312 with a vertical wall which is perpendicular to the wiring plane and to the plane of layer 316, additional resistance to detachment from force vector L can be obtained if the wall of the metal lines 312 are sloped, as in depicted by the line "M" in FIG. 12d. This permits the metal lines 312 to be wider at the top than at the bottom. A lip 326 of FIG. 12d may also be used in order to increase the strength of the structure, since the metal lines 312 must now must pass by the lip 326 of FIG. 12d.

Figure 13A:
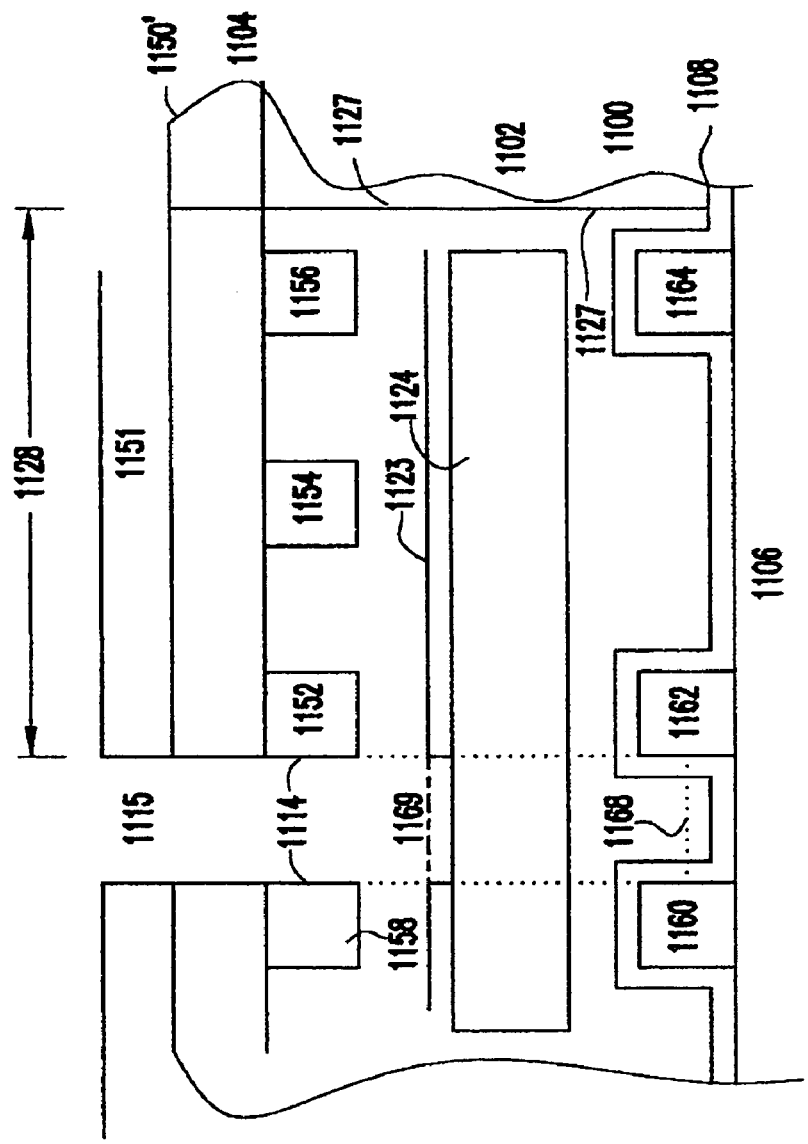
FIG. 13a shows a layered structure of the present invention.
Figure 13B:
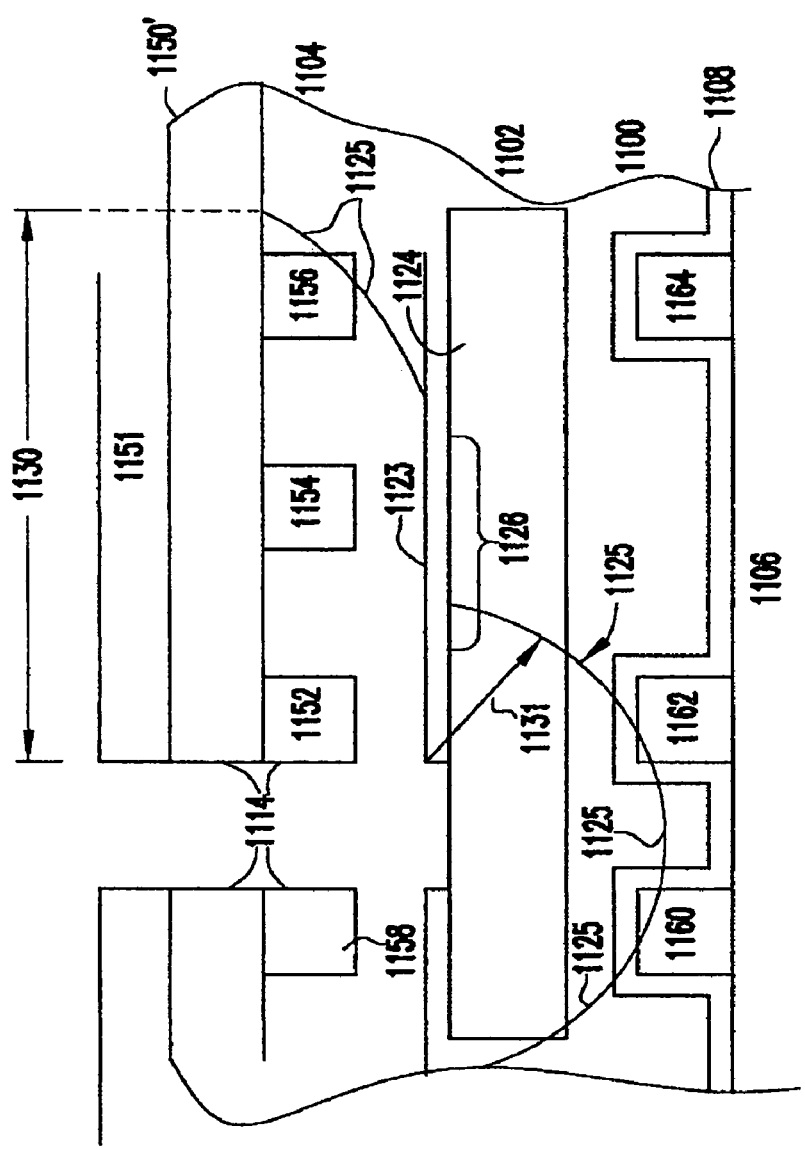
Figures 14A, 14B:
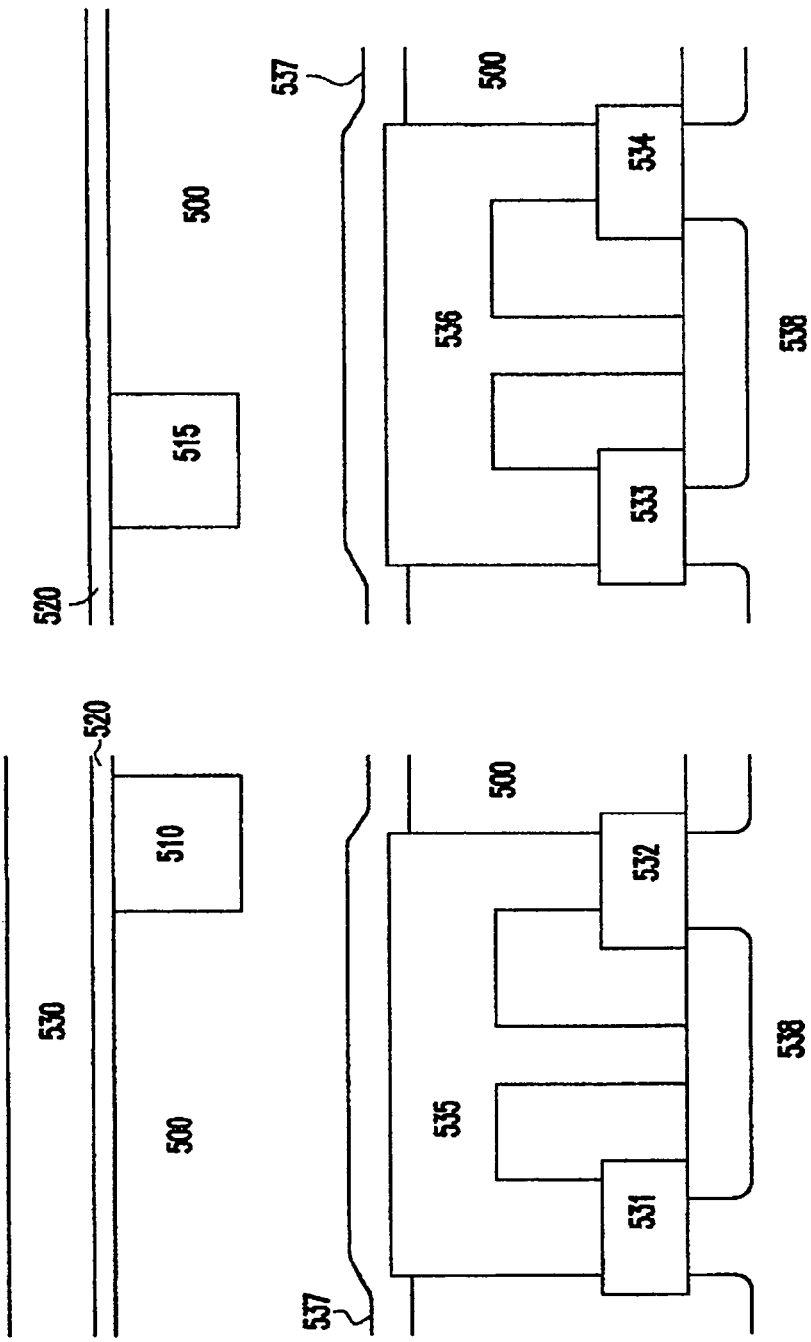

A more complete description of the venting of the structure with permanent planar overlayers is now provided in FIGS. 13a and 13b. More specifically, FIG. 13a shows a structure with several layers of wiring, where the topmost wiring layer includes wires 1158, 1152, 1154, and 1156 covered with a relatively thick layer 1150 (e.g., silicon nitride). The thick layer 1150 is not significantly attacked by the etch used to remove the removable interlayer dielectric (SiO2). The convex surfaces of FIG. 12c, are not shown for convenience.

The layer 1150 is covered with a photoresist layer 1151 which is patterned to form an opening 1115. Reactive ion etching of the layer 1150 forms a vent opening 1114 which extends down between wires 1158 and 1152. Further RIE opens the next layer 1123 (such as silicon nitride or diamond like carbon, carbon doped dielectric when combined with a removable dielectric of silicon dioxide) which is chosen to be resistant to attack during the subsequent removal of the interlayer dielectric. The vent opening 1169 does not fully overly the metal line 1124 so RIE can continue to a lower depth of the structure, terminating at 1168 in FIG. 13b. If there were additional wiring levels, the reactive ion etching could continue down to open additional vents. Finally, the photoresist layer 1151 is stripped, and the removable interlayer dielectric associated with metal layers 1104 and 1102 is removed through the vent openings 1169. The final etch front 1127 within the removable dielectric is approximately cylindrical in section having a predetermined radius 1128.

In a preferred embodiment, a gaseous HF process is used to remove a silicon dioxide removable interlevel dielectric after all vents are formed (Carbon containing layer/oxygen plasma or even organic polymer removed by decomposition thermally or by evaporation may be substituted for the oxide/vapor HF). Optionally, the interlevel dielectric is not fully removed so that if an array of vent holes is used, there are some regions in the array where remaining interlevel dielectric increases strength and rigidity of the resulting partial air dielectric structure.

In an alternative embodiment the vent is formed by an isotropic etch as shown in FIG. 13b. As previously discussed, the resist layer 1151 is patterned and RIE is used to open a vent in layer 1150. The vent 1114 passes between two metal lines 1158 and 1152 of level 1104 and into the removable interlevel dielectric of layer 1104. Next, an isotropic etch which can etch both the removable interlevel dielectric and the layer 1123 is used to form a vent in layer 1123 to form the view shown in FIG. 13b. The resulting etch front 1125 is generally hemispherical (or like a section of a hemisphere) as the description of FIGS. 10 and 11 detail, but circular steps as shown in 1126 are superimposed on the walls of a somewhat distorted hemisphere if layer 1123 etches at a slower rate than the removable interlevel dielectric. The result is an etch front in the lower removable dielectric (surrounding layer 1102) like a section of hemisphere with a radius 1131 and an etch front in the upper removable dielectric like a section of hemisphere with a radius 1130. Stopping at this point and plugging the vent hole 1114 will result in wiring surrounded by a partial air dielectric with a reduced effective dielectric constant. However it is preferable to use a second isotropic etch which selectively removes the removable interlevel dielectric with respect to the layer 1123. An array of vents will leave parallel layers 1150, 1123, and possibly additional layers for each metal layer. Each layer will have an array of holes each roughly concentric with each adjoining overlying and underlying layer which was vented by the first isotropic etch. Note in FIG. 13b that the opening in layer 1150 is roughly concentric with the opening in layer 1123.

Although layer 202 in FIG. 11 or layer 1150 in FIGS. 13a and 13b are shown as a single layer, it is contemplated by the present invention that these single layers can be composed of a two layers with a removable dielectric underlying a layer resistant to the etch used to remove the removable dielectric. Thus, the top dielectric bounds the removable dielectric with the top dielectric either residing on top of the upper layer of wiring or residing somewhat above the upper layer of wiring.

In another aspect of the invention, the air dielectric wiring is combined with micro-electromechanical (MEMS) devices. This aspect of the present invention benefits from a hybrid of two major embodiments already described. Sidewall support of the MEMS devices enables use of symmetrical vertical structures where there is less susceptibility to residual stresses than in prior art designs which are substrate supported. The hybrid design also enables easy, economical combination with copper wiring with an air dielectric. However, the resistance to stress in the sidewall supported MEMS is obtained whether or not the wiring elsewhere on the integrated circuit has an air dielectric. The detailed embodiment showing how MEMS can be combined with transistor circuit wiring is described below. The transistor circuits can be CMOS, bipolar, a combination or other transistors.

As mentioned previously, a wide range of materials can be used for the removable material or removable interlevel dielectric, besides silicon dioxide. For instance, organic or carbon containing layers like polymers or other carbon containing layers can be used as the removable layer when removed by oxygen plasmas or remote oxygen plasmas, or even organics which thermally decompose or evaporate can be used. The permanent layers or permanent dielectric structures can be composed of materials other than silicon nitride including carbon doped dielectrics or diamond-like carbon if vapor HF etching is used to remove the removable interlevel dielectric. The permanent layer is resistant to the etch used to remove the removable interlevel dielectric, or other removable material but not necessarily completely impervious toward etching. For instance, certain vapor HF etches slowly attack plasma deposited silicon nitride. It is also interesting to note that although a removeable interlevel dielectric is specified in the embodiments, a dielectric is only preferrable. The embodiments which completely remove the removable layer could in fact use a removable conductor or semiconductor. The wiring would remain shorted until the removable material is completely removed.

FIGS. 14a–18c show a cross section of transistor circuit wiring (FIGS. 14a, 15a, 16a, 17a, 18a), a cross section of the MEMS device (FIGS. 14b, 15b, 16b, 17b, 18b), and a top down view of the MEMS pattern (FIGS. 15c, 16c, 17c, 18c). More specifically and referring to FIG. 14a, an underlying wiring layer 510 and 515 is embedded in removable interlevel dielectric 500. These layers 510 and 515 are capped with layer 520 which is comprised of a material resistant to the etch to be used later to remove the removable dielectric 500. A layer of resist 530 is used to mask layer 520 in the transistor circuit wiring region of the circuit. RIE is then used to remove capping layer 520 from the MEMS region of the substrate, and wire 515 of FIG. 15b (which is exposed by the RIE) is positioned to serve as a contact for one electrode of a MEMS device, such as a switch, capacitor or resonator. Wire 515 could make electrical contact with the transistors underlying the MEMS device, or other coplanar wirings (not shown) could make electrical contact to unrelated transistors under the MEMS device.

Transistor gates 531, and 532, were previously formed and underly the circuit wiring and are part of the circuit. Transistor gates 533 and 534 underly the MEMS region. MOS transistors are shown but they could be bipolar or other transistors. The wire 535, preferably copper, is shown interconnecting transistors 531 and 532 as part of a circuit, and wire 536 interconnects transistor 533 and 534 as part of a circuit. The layer 537 is a layer resistant to the etch used to remove interlevel dielectric 500. The layer 537 is horizontal and planar as is layer 520 (except where they contact the surface of wire 535, 536, 510, 515 or others not shown where the contacting surface of the wire may be concave, convex, or raised relative to the neighboring removable dielectric). Substrate 538 is the silicon in which the transistors are formed. These transistors are understood to be present in FIGS. 15 through 18 even though they are not shown. Transistors can underly the MEMS device to be constructed because no direct connection to an underlying substrate is required.

Figure 15C:
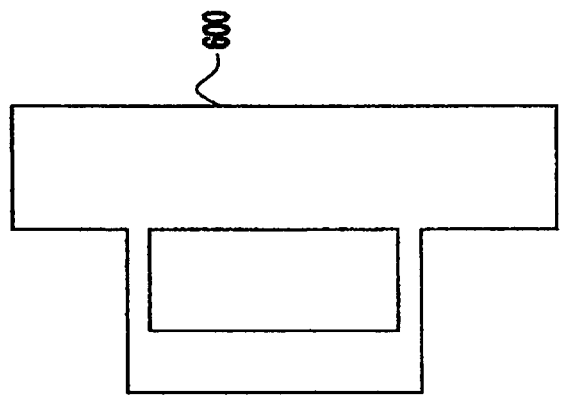
Figure 15B:
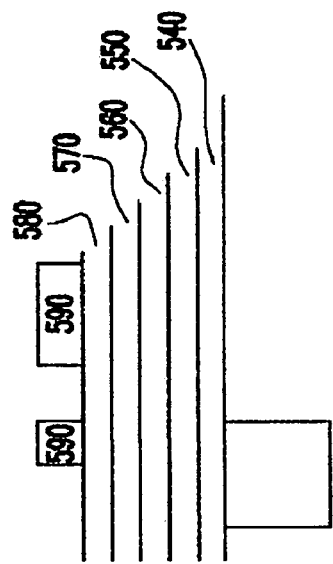
Figure 15A:
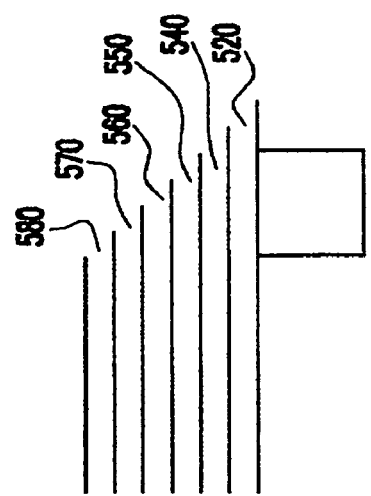

After the resist 530 is stripped then a multilayer structure is deposited in the MEMS region of FIG. 15a. The multilayer of FIG. 15a includes metal 540, removable interlayer dielectric 550, metal 560, removable interlayer dielectric 570, and optional RIE stop 580. Resist in the MEMS region 590 of FIG. 15b is patterned with the pattern 600 of FIG. 15c. The entire multilayer stack is etched with an anisotropic RIE process which stops on the layer 520 in the wiring layer. The RIE step patterns both the top and bottom electrode 560 and 540 of the MEMS device with the same pattern.

Figure 16C:
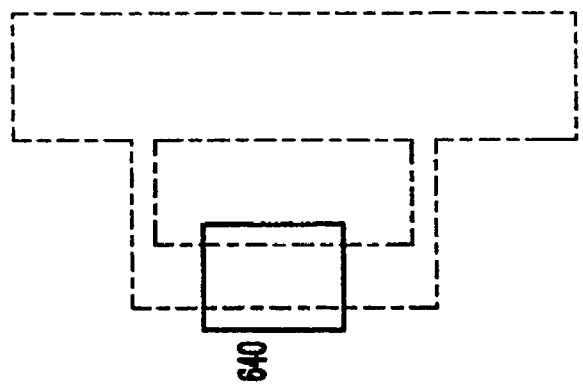
Figure 16B:
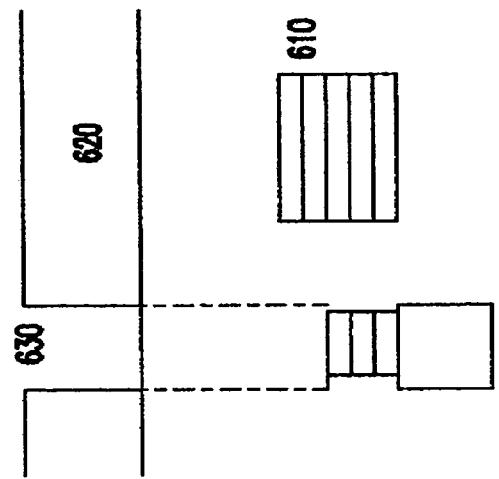
Figure 16A:
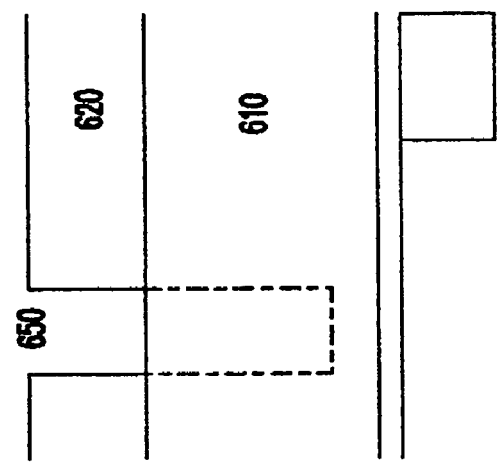

FIGS. 16a–16b show the resulting device after removable interlevel dielectric 610 is deposited and planarized, and resist layer 620 is formed and patterned. The pattern in the MEMS region is as shown in 640 of FIG. 16c, and is designed to form a trench which will contact the top electrode 560 of the MEMS device after RIE through opening 630 in resist 620 passes through the removable interlevel dielectric layer 610, optional stop layer 580, and removable interlevel dielectric 570. In the transistor circuit region, RIE through opening 650 forms a trench which will later form a wire which can be used to wire transistors in the transistor circuit region of the substrate. After RIE, the resist 620 is stripped, and a contact metal liner and copper or other metal is deposited in the trenches which were formed by RIE through the openings 630, 650. Chemical Mechanical Polishing (CMP) removes the metal from the top surface of the substrate, leaving it in the trenches to form wiring and contacts 700. As previously described, the exposed wire surface is made non-planar by CMP overpolish of copper or of dielectric 610 or by recess etching of the dielectric 610.

FIGS. 17a–17b show the structure of the present invention after deep trenches 670 and 680 are patterned by RIE with resist pattern 660 of FIG. 17c. Transistor gates 531, and 532, were previously formed and underly the circuit wiring and are part of the circuit. Transistor gates 533 and 534 underly the MEMS region. MOS transistors are shown but they could be bipolar or other transistors. Wire 535 is shown interconnecting transistors 531 and 532 as part of a circuit, and wire 536 interconnects transistor 533 and 534 as part of a circuit. Layer 537 is a layer resistant to the etch later used to remove interlevel dielectric 500. The layer 537 is horizontal and planar as is layer 520 (except where they contact the surface of wire 535, 536, 510, 515 or others not shown where the contacting surface of the wire may be concave, convex, or raised relative to the neighboring removable dielectric). Substrate 538 is the silicon in which the transistors are formed. These transistors are understood to be present in FIGS. 15 through 18, even though not shown. Transistors can underly the MEMS device to be constructed because no direct connection to an underlying substrate is required.

After trench formation, the deep trenches 670 and 680 are filled with a resistant material, which is resistant to the etch used to remove the removable dielectric. A layer 690 of the resistant material is simultaneously formed on the wires or contacts 700 (FIGS. 17a and 17b). Alternatively, the trenches are lined, but not filled with the resistant material. This produces a thin compliant support for resonators where the energy in a vibrating structure must not be dissipated by the support structures. Note that the permanent horizontal layer 690 in the transistor circuit region of FIGS. 17a and 18a is a horizontal planar layer, except where the wiring is made non-planar by chemical mechanical polishing (CMP) or by recessing the surrounding dielectric, 610. The supporting permanent planar layer contacts the non-planar wire surface in these regions, increasing the area of contact between wire and support. Use of sidewall supported electrodes instead of the prior art substrate supported MEMS elements or electrodes enables considerable process simplification. For example, separate lithography steps are not required to pattern each electrode and to pattern the dielectric spacer which separates the bottom electrode and substrate from the top electrode. This reduces to two lithography steps for the sidewall supported MEMS elements of the current invention; one lithography step is required to pattern both electrodes simultaneously and one lithography step is required to define sidewall supports.

FIGS. 18a–18c show the structure after the resist 715 is patterned to form vents 710 and 720. After resist patterning, RIE is used to etch through the layer 690 in both the Transistor circuit and MEMS regions. The pattern in the MEMS region is shown as reference numeral 660 of FIG. 18c. After vent formation, all or part of the removable interlevel dielectric is removed from the structure to leave air dielectric in the Transistor circuit region and freestanding electrode plates in the MEMS region. The electrodes 540 and 560 (shown in FIGS. 15a and 15b) are now freestanding except where supported at the sidewall by sidewall pillars 670 or by contacts. The plate 580 (shown in FIGS. 15a and 15b) may also still be present, but does not interfere with operation of the MEMS device. The vent holes can then be plugged by a low pressure plasma deposited dielectric. Although the term "air dielectric: is used, the wiring and MEMS can be surrounded by a partial vacuum.

FIG. 18b shows that previously described transistors 533 or 534 or transistor wiring 536 can even reside directly underneath the micro-electromechanical (MEMS) device because it does not need to have a mechanical connection directly underneath the device. The sidewall support 670 can connect the edges of each electrode 540 and 560 and upward to planar layer 690 which connects laterally to wire 700, thus supporting the device from above. Although support from above is the preferred embodiment, it is important to note that a sidewall supported MEMS device with the sidewall reaching down to a fixed substrate support is also contemplated by the present invention as is a single moveable electrode MEMS device with sidewall support.

To this end, consider the previously described embodiment; if layer 500 is made of a permanent material instead of a removable material, then electrode 540 is fixed by 500 instead of being moveable. There is only one moveable electrode 560 with sidewall support down to the underlying fixed substrate support. A MEMS device with a single moveable electrode which is supported by a sidewall support likewise has simplified construction and reduced interference, reduced energy dissipation, and reduced electrode bowing with a sidewall support, especially if the sidewall is made very thin. If the sidewall is compliant, some stress can be relieved by motion of the sidewall support instead of by electrode bowing.

The MEMS device of FIGS. 15–18 have two electrodes 540, 560 which are placed opposing each other separated by a small gap 730 with a dimension determined by the thickness of the removable material 550 (which is later removed to make both electrodes moveable). In operation, the relative distance of the two electrodes can change as there is movement in response to a voltage difference applied between them. Although the above embodiments describe metal electrodes, the electrodes could also be a dielectric with conductive or metal areas embedded in the dielectric. It is important to note that MEMS with two moveable electrodes is a novel structure, especially when both electrodes are of similar construction and therefore have similar stresses (and even when constructed without sidewall support). However, it is easier to have similar electrode shapes, supports and stresses with sidewall support because there is no need to have a patterned permanent dielectric support (which makes identical smooth electrode surfaces difficult) between the opposing electrodes, or to have electrodes supported by distant contacts to an underlying substrate.

FIGS. 18a–18c show how stresses within the electrodes relax. Assume the electrode 540 and the electrode 560 both are built with (compressive) stress shown by arrow 740. When the removable material is removed to enable movement of the electrodes, they will respond by buckling downward in the direction shown by arrow 750. If the electrodes are similar, with similar stresses, and similar support, the buckling will be matched in each electrode, with little change in relative electrode spacing.

In the embodiment just described, a number of processes can be carried out simultaneously in the MEMS and the transistor circuit regions. For instance, the wiring, 700, in the circuit region and the wiring used to make electrical contact to the MEMS device, 700, are formed simultaneously, the supports in the MEM region, 670 and 690, and for the wiring in the transistor region, 680 and 690, are formed simultaneously. The dielectric, 500 and 610, in the transistor region and in the MEMS region are simultaneously removed.

Thus, as seen in FIGS. 14a–18c, the wiring is supported predominantly by the planar layers which are parallel to the wafer surface 690, and the MEMS device and relative electrode spacing is supported by and determined by sidewall pillars 670. It would be impossible to support the MEMS device and maintain the relative electrode spacing with planar layers such as layer 690. Thus, the hybrid support with planar layers in the Transistor circuit wiring and sidewall support in the MEMS region is ideal.

It is important to note that since both electrodes of the MEMS device are freestanding, and since both electrodes have experienced similar process treatments, the stresses within each electrode is similar. Also, since both electrodes are supported in a similar fashion, the movements and deformations of the final structure which enable relief of those "stresses of construction" are similar. This enables a narrower gap between the electrodes. This is in contrast to a device with one electrode fixed on a substrate and one movable electrode. In this case stresses of construction will be released by motion of only one electrode, and resulting bowing or motion will alter the gap between the electrodes and perhaps even cause shorting of electrodes. Also, both electrodes of the present invention are able to move in response to an applied voltage, therefore switches or capacitors or resonators constructed with two movable electrodes will have a greater response to a given applied voltage than with one electrode fixed and only one moveable.

The resulting structure of the present invention is also resistant to undesireable relative motion of the two MEMS electrodes caused by sudden acceleration of the device (such as caused by dropping). Since both electrode plates are movable and are of similar construction, most motion will be experienced by both plates, leading to little relative motion. This again is in contrast to prior art construction where one plate is fixed by a substrate. Neither MEMS electrode nor sidewall supports must make contact with the underlying substrate enabling transistors to underly the MEMS device and unrelated wiring to coexist in the same region. The MEMS electrodes are suspended above the silicon substrate.

In view of the above description, those of ordinary skill in the art should now recognize, in addition to the above, the following advantages of the present invention:

1. Planar support in wiring, in combination with sidewall support, and sidewall support in MEMS;
2. A process sequence having common multiple steps thus lowering costs. These common process sequences include air gap formation, contacts, wires, formation of support materials, etc;
3. The present invention can use a dissimilar MEMS material;
4. The present invention is useful for AC/DC switch and voltage operated capacitor;
5. The formation of the MEMS of the present invention have a structure with less sensitivity to stresses;
6. The formation of MEMS of the present invention have a structure less susceptible to acceleration;
7. The formation of MEMS of the present invention have high electrical conductivity contact and wiring (Cu elements);
8. The formation of MEMS of the present invention have having improved drive voltage/gap trade-off. (switch, capacitor and resonator);
8. There is a simplified construction due to the suspension of MEMS devices without substrate contact; and
9. The formation of MEMS having unrelated wiring underneath.
10. The formation of MEMS having transistors positioned underneath the MEMS.

As described herein, the embodiments include wiring structures from which $SiO_2$ has been removed using gaseous HF. Prior art wiring structures may be improved using an $SiO_2$ fill which is subsequently removed using gaseous HF. For example support type wiring structures may be formed much more simply by forming the HF resistant supports in $SiO_2$ and then removing the $SiO_2$ using gaseous HF.

While the invention has been described in terms of preferred embodiments, those skilled in the art will recognize that the invention can be practiced with modification within the spirit and scope of the appended claims.

I claim:

1. A wiring structure comprising:
   at least one wiring layer including an upper layer residing in an upper wiring plane;
   an inner dielectric layer supporting the upper wiring plane;
   a top dielectric layer bounding a top of the inner dielectric layer;
   at least one etched region of a predetermined shape forming an increased air gap in the inner dielectric layer and covered at a top region by the top dielectric layer,
   wherein wires in the at least one wiring layer extend from within the etched region to a neighboring non etched perimeter region of the inner dielectric layer.

2. The wiring structure of claim 1, wherein the non-etched perimeter region is a thin wall of dielectric and the remaining inner dielectric is etched to form increased air gaps.

3. The wiring structure of claim 2, wherein the at least one wiring layer includes at least two wiring layers, the at least two wiring layers including a lower layer residing in a lower wiring plane beneath the upper wiring plane.

4. The wiring structure of claim 3, further comprising:
   a gap between the upper wiring plane and the lower wiring plane; and
   a plurality of insulator side support walls attaching to a lower wire in the lower layer and extending substantially upward and attaching to a side of an upper wire in the upper layer and extending along a length of travel of the side surface of the upper wire, the plurality of side support walls supporting the upper wire over the gap over the lower wire.

5. The wiring structure of claim 4, wherein:
   the plurality of side support walls span the gap between the upper wiring plane and the lower wiring plane such that a surface of the plurality of side support walls attaching to the side of the upper wire contacts the gap, and
   the gap extends along the length of travel of the upper wire parallel to the surface of the plurality of insulator side support walls attaching to the side of the upper wire.

6. The wiring structure of claim 4, wherein the at least one etched region which of the predetermined shape is selected from sections of a hemisphere or cylinder and are openings which form the plurality of insulator side support walls in non-etched perimeter regions.

7. The wiring structure of claim 1, wherein the at least one wiring layer is at least three wiring layers, including a top wiring layer above and orthogonal to the upper wiring layer and a lower wiring layer beneath the upper wiring layer and further comprises:

a plurality of insulator plates extending upward from and attached to the upper layer, each of the insulator plates are attached to a side of a wire in the top layer.

8. The wiring structure of claim 1, wherein the at least one etched region is two or more etched regions which form a section of a hemisphere or a cylinder.

9. The wiring structure of claim 8, wherein some of the etched regions have a boundary which overlaps with an adjacent one of the etched regions.

10. A wiring structure comprising:
   at least two wiring layers including an upper layer residing in an upper wiring plane and a lower layer residing in an lower wiring plane;
   a gap between the upper wiring plane and the lower wiring plane; and
   a plurality of insulator side support walls formed by an array of openings in a dielectric, the plurality of insulator side support walls attaching to a lower wire in the lower layer and extending substantially upward and attaching to a side surface of an upper wire in the upper layer and extending along a length of travel of the side surface of the upper wire, the plurality of side support walls spanning the gap between the upper wiring plane and the lower wiring plane and remotely supporting the upper wire over the gap and the lower wire within the openings.

11. The wiring structure of claim 10, further comprising at least one hemispherical or cylindrical etched region forming an air gap, the at least one hemispherical etched region forming the openings in the plurality of side support walls.

12. The wiring structure of claim 11, wherein the upper wiring layer includes more than one upper wire, at least one of the more than one upper wire extends into the hemispherical or cylindrical etched region.

13. A wiring structure comprising:
   first and second wiring layers;
   each wire of the first and second layers having a top, a bottom and sides;
   an etched region arranged between the first and second wiring layers;
   the etched region comprising insulator side support walls and air gap openings;
   the insulator side support walls having one end attached to the sides of the wires of the first wiring layer and another end attached to the sides of the wires of the second wiring layer,
   wherein the side support walls span between the first and second wiring layers and support the wires of the first wiring layer over the air gap openings.

14. The wiring structure of claim 13, wherein the etched region comprises two or more etched regions which form a section of a hemisphere or a cylinder.

* * * * *